(12) United States Patent
Imai

(10) Patent No.: US 9,214,562 B2
(45) Date of Patent: Dec. 15, 2015

(54) METHOD OF MANUFACTURING FIELD-EFFECT TRANSISTOR, FIELD-EFFECT DISPLAY DEVICE AND ELECTROMAGNETIC WAVE DETECTOR

(75) Inventor: Shinji Imai, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 959 days.

(21) Appl. No.: 12/788,298

(22) Filed: May 27, 2010

(65) Prior Publication Data
US 2010/0308325 A1 Dec. 9, 2010

(30) Foreign Application Priority Data
Jun. 4, 2009 (JP) ................................. 2009-135489

(51) Int. Cl.
*H01L 29/10* (2006.01)
*H01L 29/12* (2006.01)
(Continued)

(52) U.S. Cl.
CPC ........ *H01L 29/7869* (2013.01); *H01L 27/1214* (2013.01); *H01L 27/1225* (2013.01); *H01L 27/1288* (2013.01); *H01L 21/02554* (2013.01); *H01L 21/02565* (2013.01)

(58) Field of Classification Search
USPC ........ 257/43, 59, 72, 412, E31.086, E31.092, 257/E27.14, E21.411; 439/38, 39, 42, 122, 439/138, 142; 250/370.09; 438/29, 34, 104, 438/149, 151
See application file for complete search history.

(56) References Cited

U.S. PATENT DOCUMENTS

| 5,501,943 A * | 3/1996 | Swirbel .......................... 430/313 |
| 2006/0079034 A1* | 4/2006 | Hoffman et al. .............. 438/151 |

(Continued)

FOREIGN PATENT DOCUMENTS

| JP | 2007-073705 A | 3/2007 |
| JP | 2008-071801 | 3/2008 |

(Continued)

OTHER PUBLICATIONS

English language translation of the following: Office action dated May 7, 2014 from TIPO in a Taiwanese patent application corresponding to the instant patent application. This office action translation is submitted now in order to supplement the understanding of patent document TW200845399, TW200919591 and TW2004136744 which are cited in the office action and are being disclosed in the instant Information Disclosure Statement.

(Continued)

*Primary Examiner* — Meiya Li
(74) *Attorney, Agent, or Firm* — SOLARIS Intellectual Property Group, PLLC

(57) ABSTRACT

There is provided a method of manufacturing a field-effect transistor, in which on a electroconductive layer including a source electrode, a drain electrode and pixel electrode formed by a conductive layer-forming, an inorganic insulating layer containing an inorganic material as a main component is formed so as to cover the electroconductive layer and an oxide semiconductive layer, and after a photoresist film is formed on the inorganic insulating layer and is exposed in a pattern shape, a resist pattern is formed by being developed using a developer in development, and by removing the area exposed from the resist pattern in the inorganic insulating layer by using the developer as an etching liquid, a part of the electroconductive layer is exposed, thereby forming a contact hole; a field-effect transistor, a display device and an electromagnetic wave detector.

8 Claims, 14 Drawing Sheets

(51) Int. Cl.
*H01L 29/786* (2006.01)
*H01L 27/12* (2006.01)
*H01L 21/02* (2006.01)

(56) References Cited

U.S. PATENT DOCUMENTS

| | | | |
|---|---|---|---|
| 2007/0015319 A1* | 1/2007 | Chin et al. | 438/149 |
| 2008/0064223 A1 | 3/2008 | Eguchi et al. | |
| 2008/0145795 A1* | 6/2008 | Yudhistira et al. | 430/313 |
| 2009/0076322 A1 | 3/2009 | Matsunaga et al. | |
| 2009/0283762 A1* | 11/2009 | Kimura | 257/43 |
| 2010/0213459 A1 | 8/2010 | Shimada et al. | |
| 2011/0104900 A1* | 5/2011 | Hinsberg et al. | 438/694 |
| 2012/0132911 A1 | 5/2012 | Shimada et al. | |

FOREIGN PATENT DOCUMENTS

| | | |
|---|---|---|
| JP | 2009-089351 | 4/2009 |
| JP | 009-099944 | 5/2009 |
| TW | 200413744 | 8/2004 |
| TW | 200845399 | 11/2008 |
| TW | 200919591 | 5/2009 |

OTHER PUBLICATIONS

English language translation of the following: Office action dated Sep. 17, 2013 from the JPO in a Japanese patent application corresponding to the instant patent application. This office action translation is submitted now in order to supplement the understanding of patent document JP2009-089351, JP2008-071801 and JP2009-099944 which are cited in the office action and are being disclosed in the instant Information Disclosure Statement.

* cited by examiner

METHOD OF MANUFACTURING FIELD-EFFECT TRANSISTOR, FIELD-EFFECT DISPLAY DEVICE AND ELECTROMAGNETIC WAVE DETECTOR

CROSS-REFERENCE TO RELATED APPLICATION

This application claims priority under 35 USC 119 from Japanese Patent Application No. 2009-135489, filed on Jun. 4, 2009, the disclosure of which is incorporated by reference herein.

BACKGROUND OF THE INVENTION

1. Field of the Invention

The present invention relates to a method of manufacturing a field-effect transistor, a field-effect transistor, a display device and an electromagnetic wave detector.

2. Description of the Related Art

In recent years, with the progress of the liquid crystal and electroluminescence (EL) technologies and the like, flat panel display devices (FPD) are put into practical use. In particular, since high bright-light emission at low voltage can be achieved by using organic electroluminescent devices (hereinafter, may be recited as "organic EL devices") using a thin film material which is excited by applying electric current thereto, it is expected that thinning, weight saving, downsizing and electric power saving of devices in a wide range of areas including mobile phone displays, personal digital assistants (PDA), computer displays, automobile information displays, TV monitor displays and generic illumination are realized. Further, these FPDs are driven by an active matrix circuit of a field-effect transistor (hereinafter, may be referred to as a TFT) in which an amorphous silicon thin film or a polycrystalline silicon thin layer formed on a glass substrate is used for an oxide semiconductor layer.

On the other hand, attempts to use a lightweight and flexible resin substrate in place of the glass substrate of FPD have been made for improving the thinning, weight saving and resistance to breakage. However, the manufacture of transistors using the silicon thin film requires a heating process at a relatively high temperature, so that in general, it is difficult to form the silicon thin film directly on a resin substrate with low heat-resistance. Accordingly, development of TFTs using oxide semiconductors capable of forming a film at low temperature is now actively being carried out. The oxide semiconductor is capable of film-forming at room temperature, and being formed on a film, thereby attracting the attention as a material of the oxide semiconductors. Further, in such a TFT, for the purpose of protecting and electrically insulation-separating an oxide semiconductor layer or a electroconductive layer including a source electrode and a drain electrode provided in the TFT, an insulation layer so as to cover the areas corresponding to the oxide semiconductor layer or the conductive layer is generally provided. As a layer equivalent to the insulation layer having such a function, the use of silicon oxide is disclosed in Japanese Patent Application Laid-Open (JP-A) No. 2007-73705.

Here, the TFT is suitably applied to electromagnetic wave detectors which detect electromagnetic waves such as X-rays, or displays using a liquid crystal element and an organic EL (electroluminescence) element. When the TFT is applied to various devices such as these electromagnetic wave detectors, display elements or the like, it is necessary to connect electrically a part of the electroconductive layer to the elements provided in these various devices. Accordingly, when the TFT is applied to these various devices, the insulation layer formed on the electroconductive layer is processed to form a contact hole, so that a part of the electroconductive layer is exposed, and the electroconductive layer is electrically connected to the various devices via the exposed area.

However, since the silicon oxide ($SiO_2$) recited in JP-A No. 2007-73705 as a constituent material for the insulation layer has an alkali resistance as well as an acid resistance, it is necessary to select a processing by dry-etching, resulting in a problem of an increase in production cost.

Moreover, in JP-A No. 2007-73705, although an embodiment in which materials other than silicon oxide are used is disclosed, since the processing is carried out by an argon milling method, there is a problem with the processing such that the surface of the insulation layer is susceptible to damage at the time of the processing of the insulation layer. Further, a method of the use of a strong acidic solution for processing the insulation layer is conceivable, but this method may be problematic because of the occurrence of erosion of the insulation layer.

SUMMARY OF THE INVENTION

The present invention has been made in view of the above circumstances and provides a method of manufacturing a field-effect transistor, a field-effect transistor, a display device and an electromagnetic wave detector.

A first aspect of the present invention provides a method of manufacturing a field-effect transistor including a substrate, a gate electrode, a gate insulating film, a source electrode, a drain electrode, a pixel electrode, an oxide semiconductor layer containing an oxide semiconductor as a main component and an inorganic insulating layer containing an inorganic material as a main component, the method comprising:

forming an electroconductive layer containing at least one of the source electrode, the drain electrode or the pixel electrode;

forming the inorganic insulating layer so as to cover the electroconductive layer and the oxide semiconductor layer;

resist-forming a photoresist film on the inorganic insulating layer;

exposing the photoresist film in a pattern shape; and developing, using a developer, the exposed photoresist film to form a resist pattern, and removing an area of the inorganic insulating layer exposed from the resist pattern by using the developer as an etching liquid, thereby exposing a part of the electroconductive layer.

A second aspect of the present invention provides a method of manufacturing a field-effect transistor including a substrate, a gate electrode, a gate insulating film, a source electrode, a drain electrode, a pixel electrode, an oxide semiconductor layer containing an oxide semiconductor as a main component and an inorganic insulating layer containing an inorganic material as a main component, the method comprising:

forming an electroconductive layer containing at least one of the source electrode, the drain electrode or the pixel electrode;

forming the inorganic insulating layer so as to cover the electroconductive layer and the oxide semiconductor layer;

resist-forming a photoresist film on the inorganic insulating layer;

exposing the photoresist film in a pattern shape;

forming a resist pattern by developing, using a developer, the exposed photoresist film; and processing an area of the inorganic insulating layer exposed from the resist pattern by using an etching liquid to remove the exposed area, thereby exposing a part of the electroconductive layer.

A third aspect of the present invention provides a field-effect transistor manufactured by the method of manufacturing the field-effect transistor according to the first aspect of the present invention or the second aspect of the present invention.

A fourth aspect of the present invention provides a display device equipped with a field-effect transistor manufactured by the method of manufacturing the field-effect transistor according to the first aspect of the present invention or the second aspect of the present invention.

A fifth aspect of the present invention provides an electromagnetic wave detector equipped with a field-effect transistor manufactured by the method of manufacturing the field-effect transistor according to the first aspect of the present invention or the second aspect of the present invention.

BRIEF DESCRIPTION OF THE DRAWINGS

Exemplary embodiments of the present invention will be described in detail on the following figures, wherein.

Figure 3:
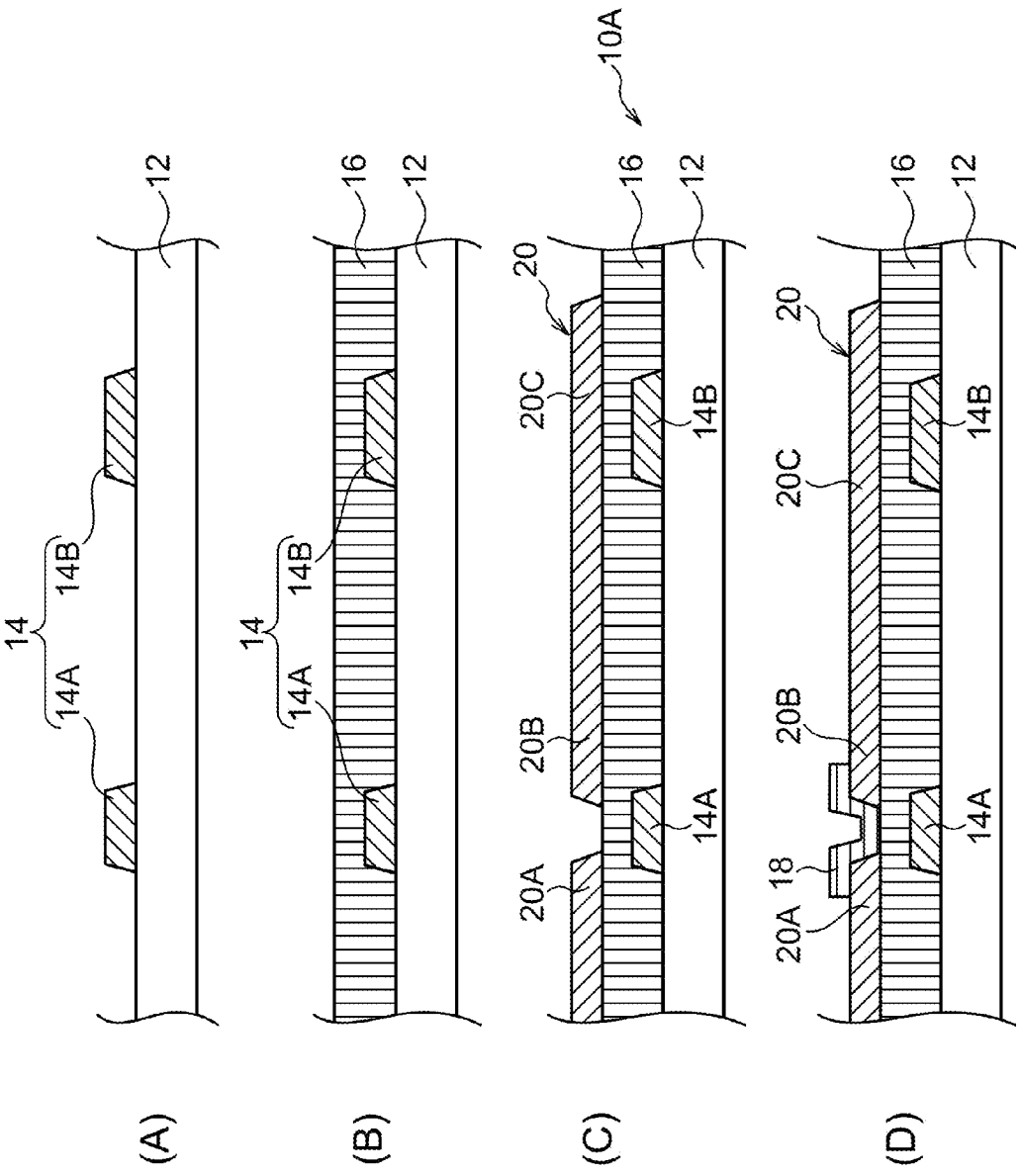
Figure 4:
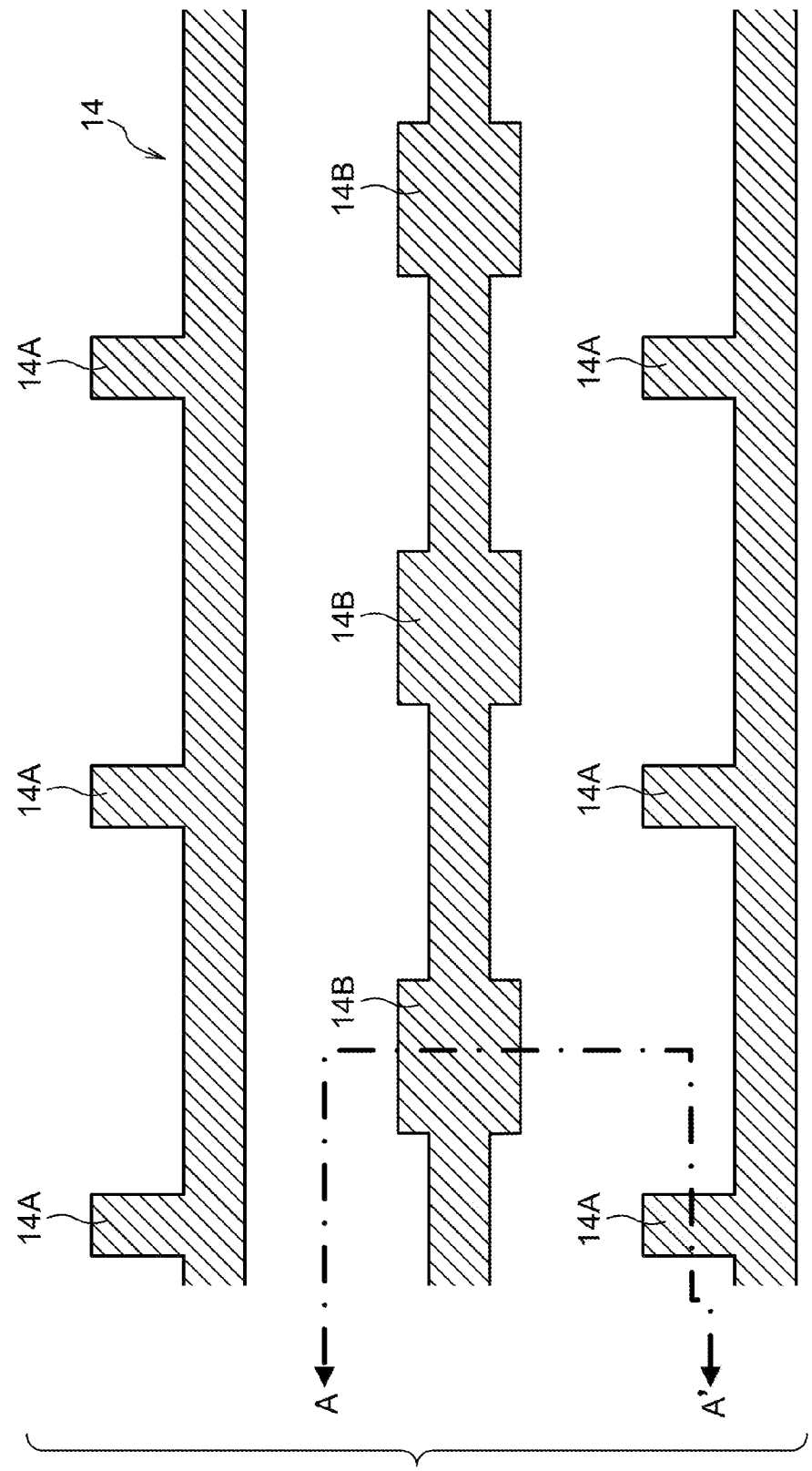
Figure 5:
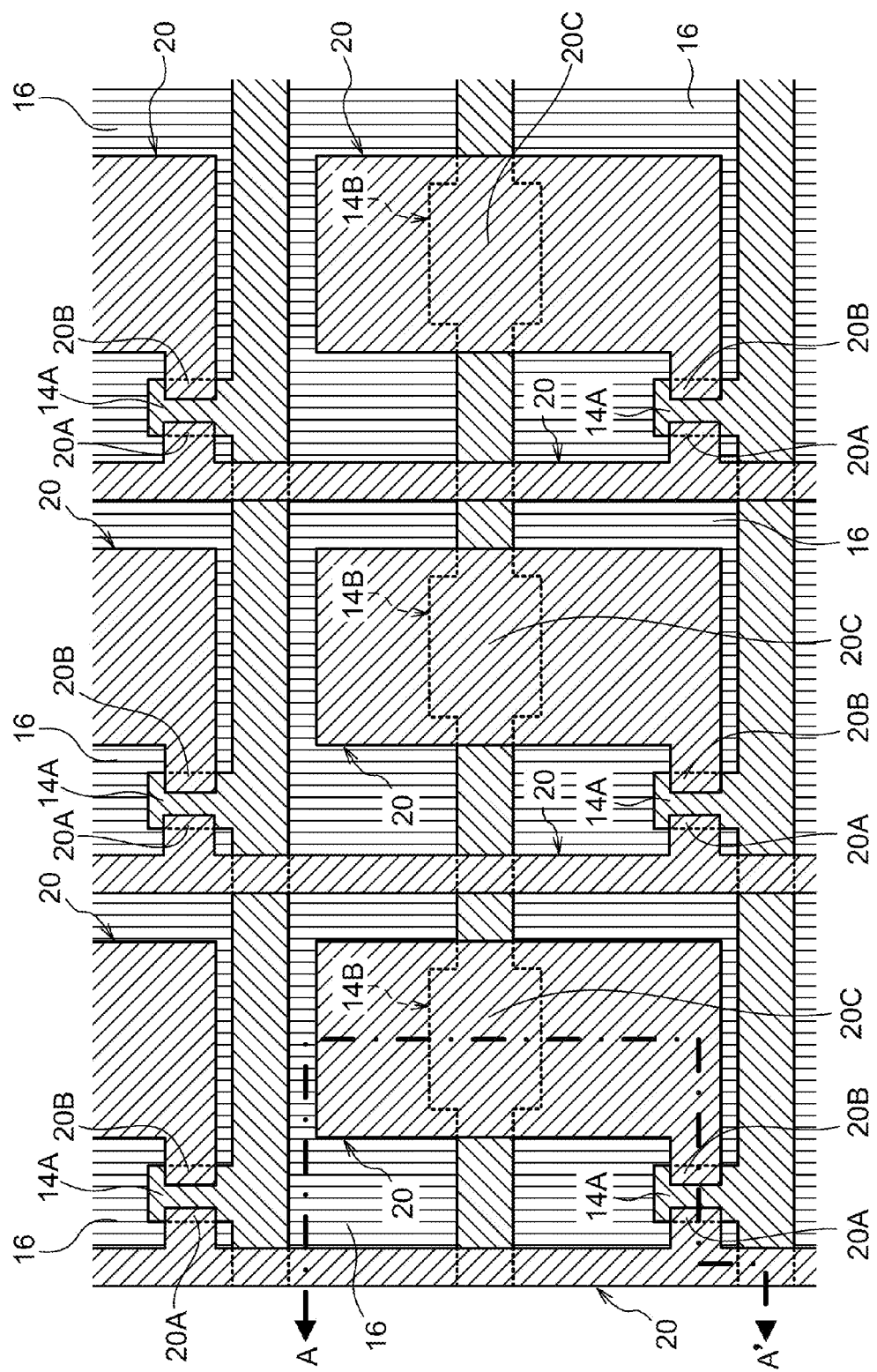
Figure 6:
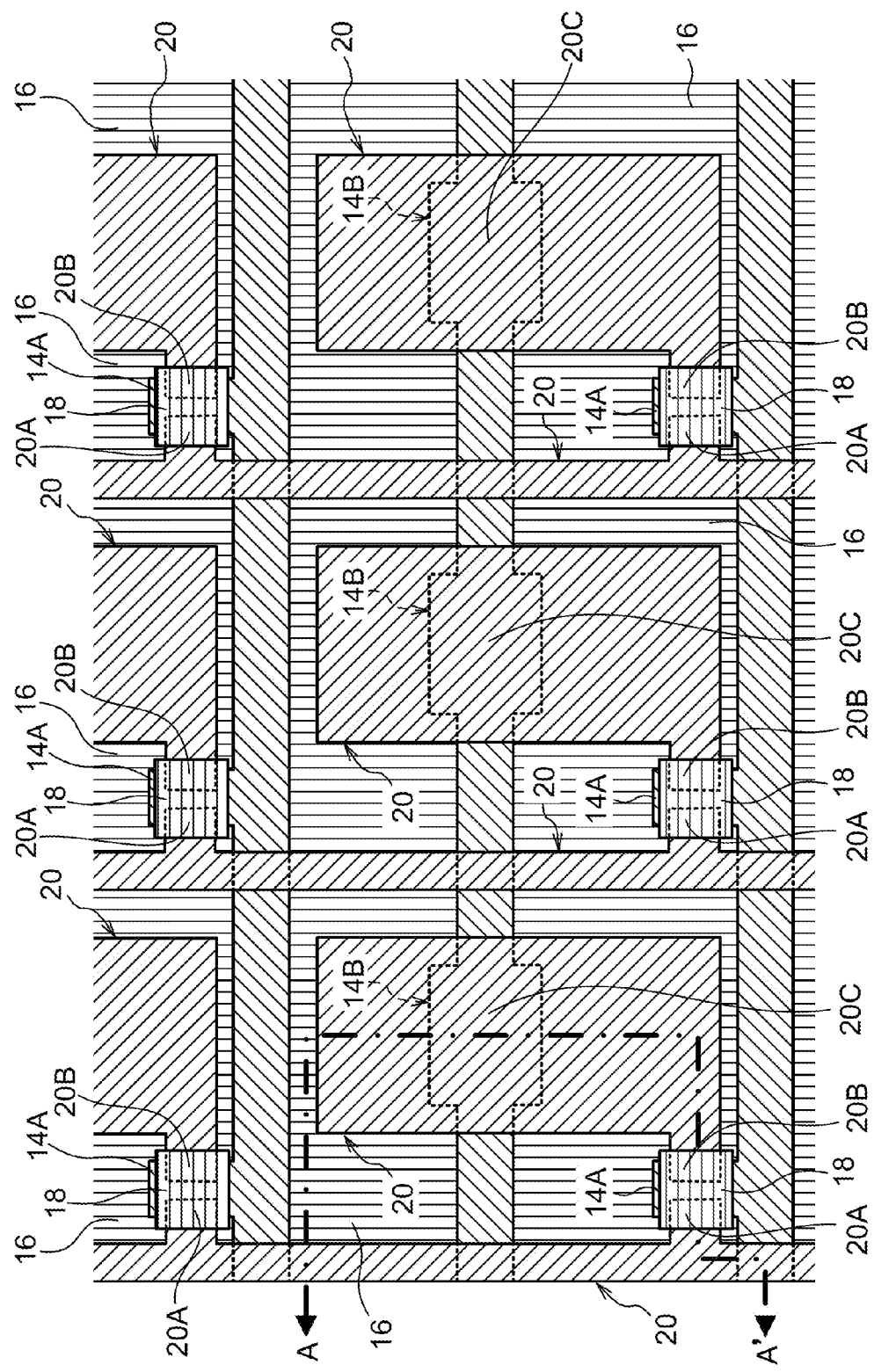
Figure 7:
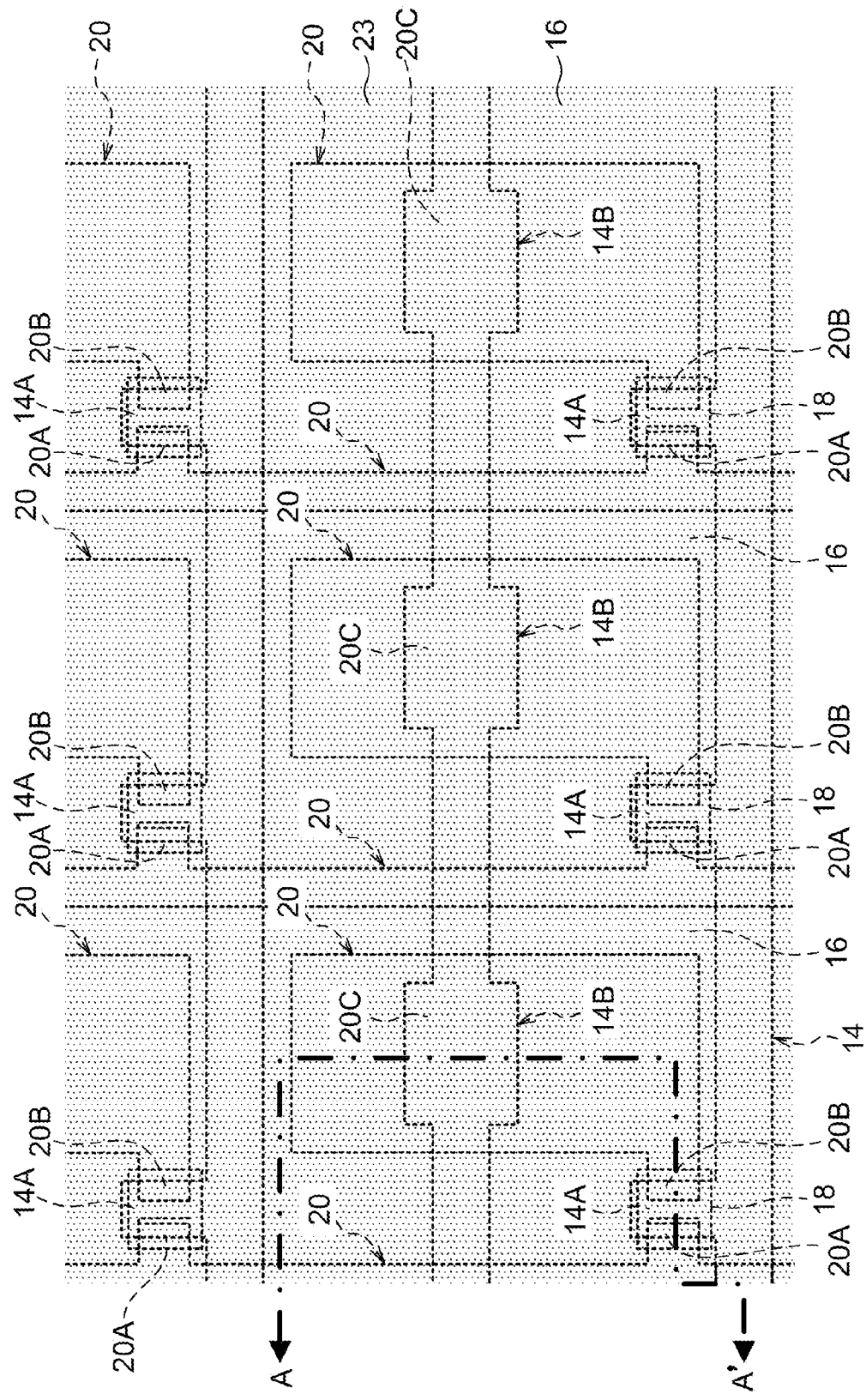
Figure 8:
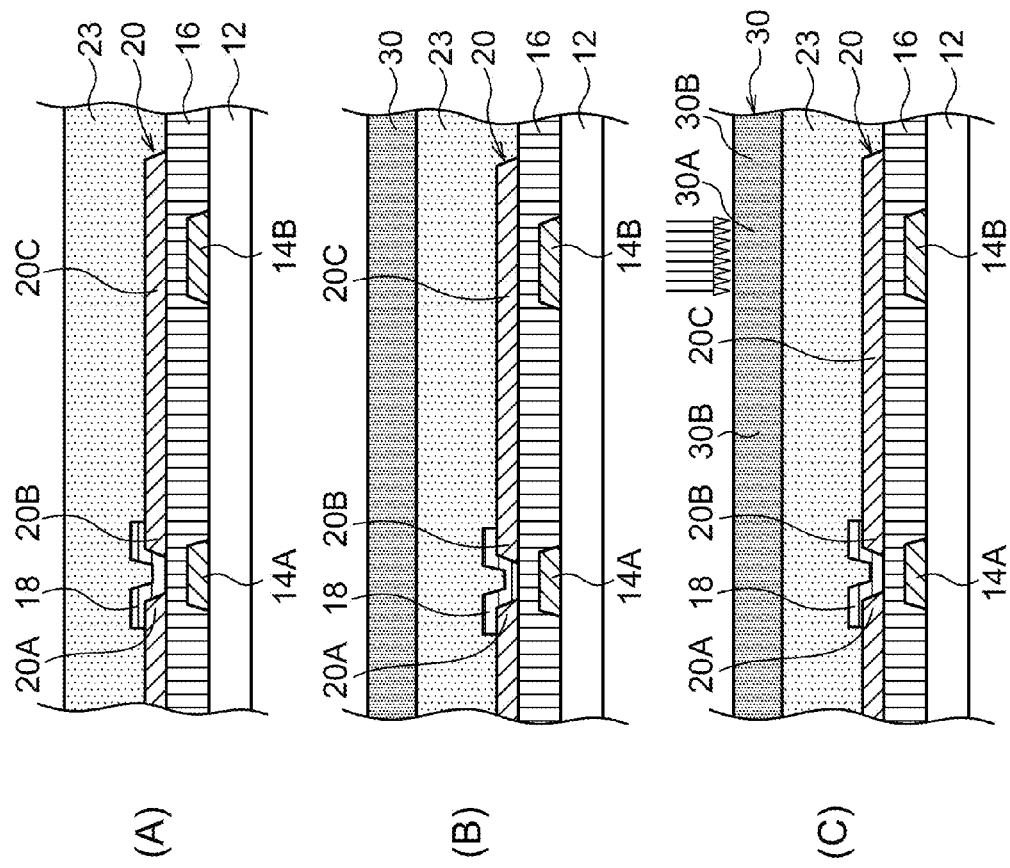
Figure 9:
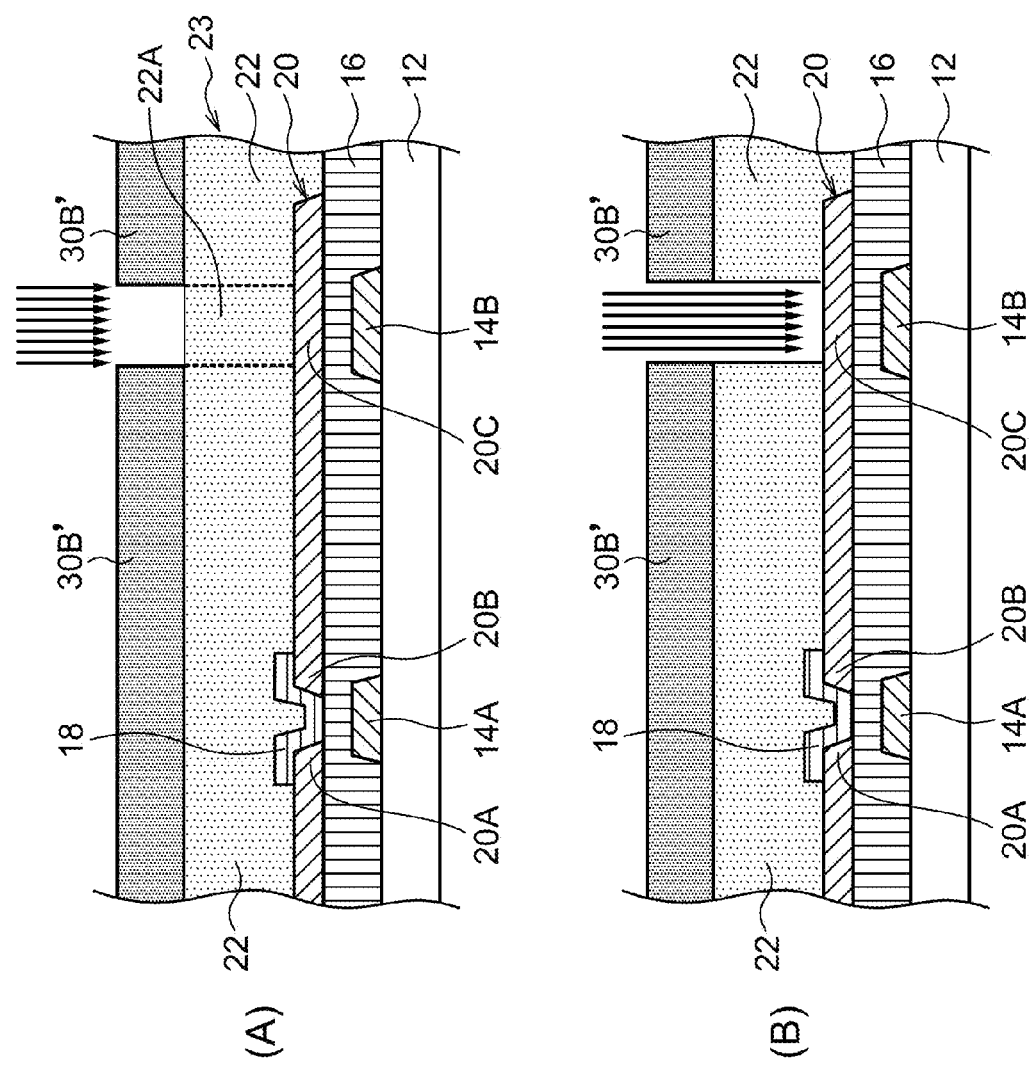
Figure 10:
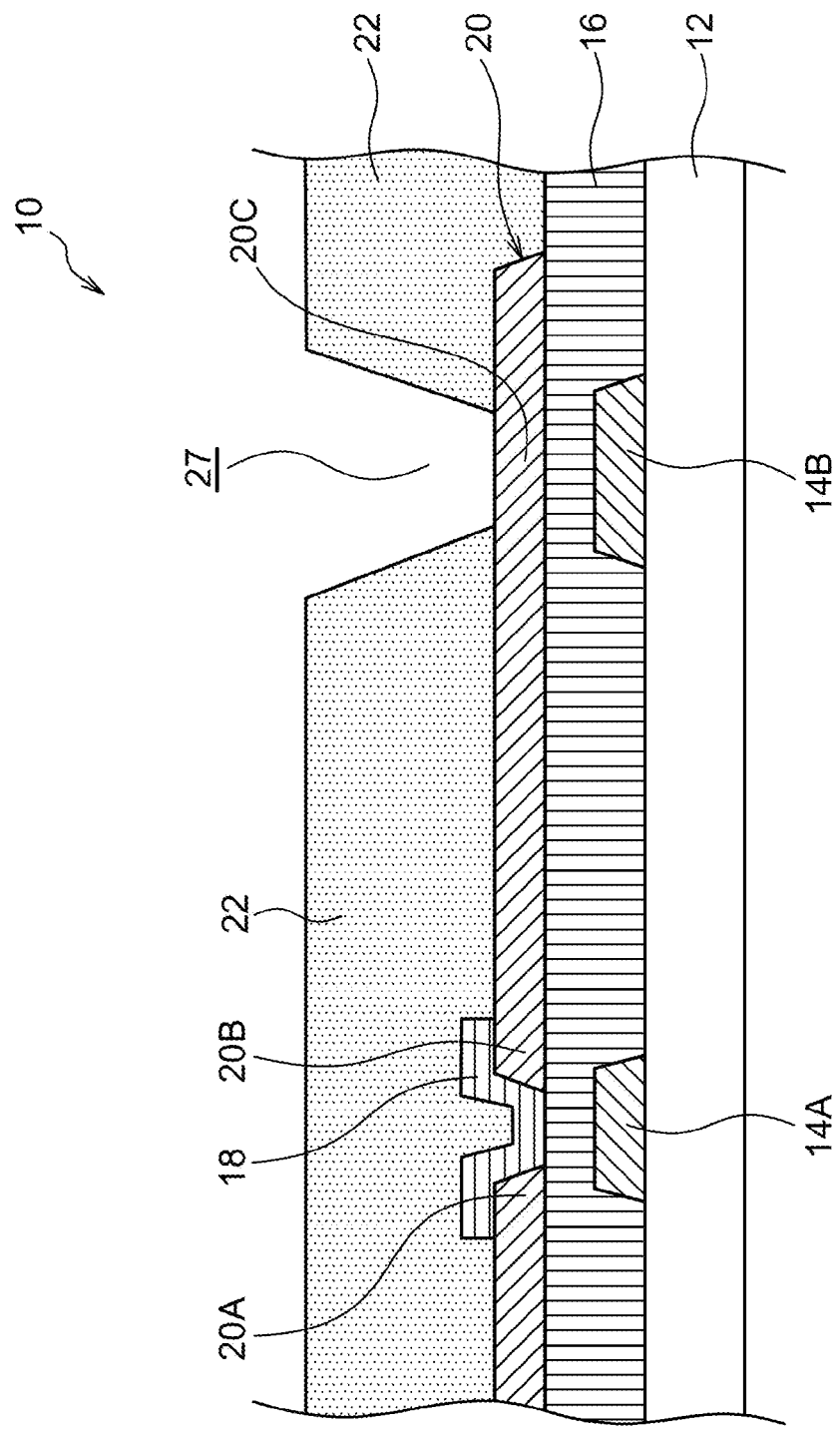
Figure 11:
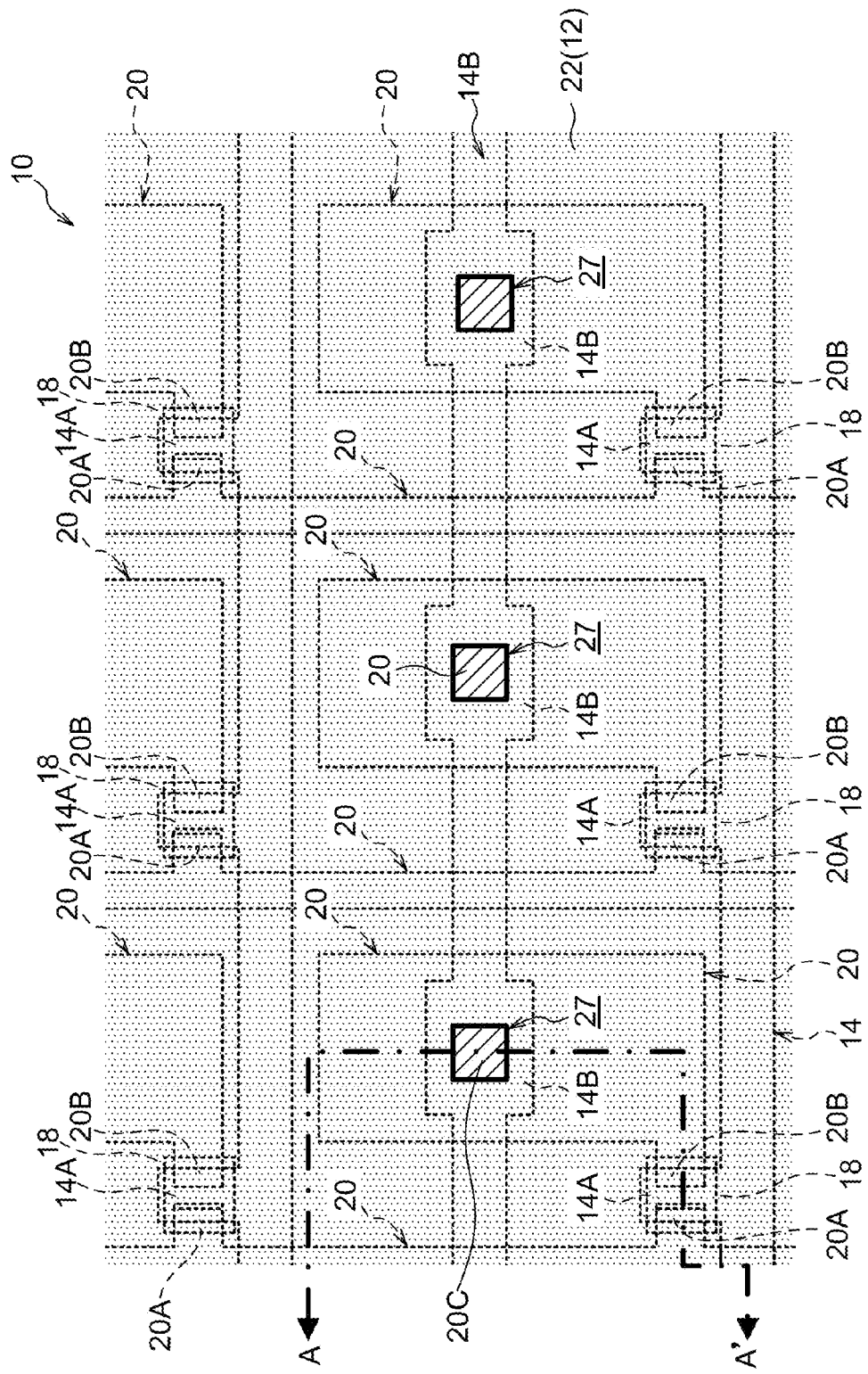
Figure 12:
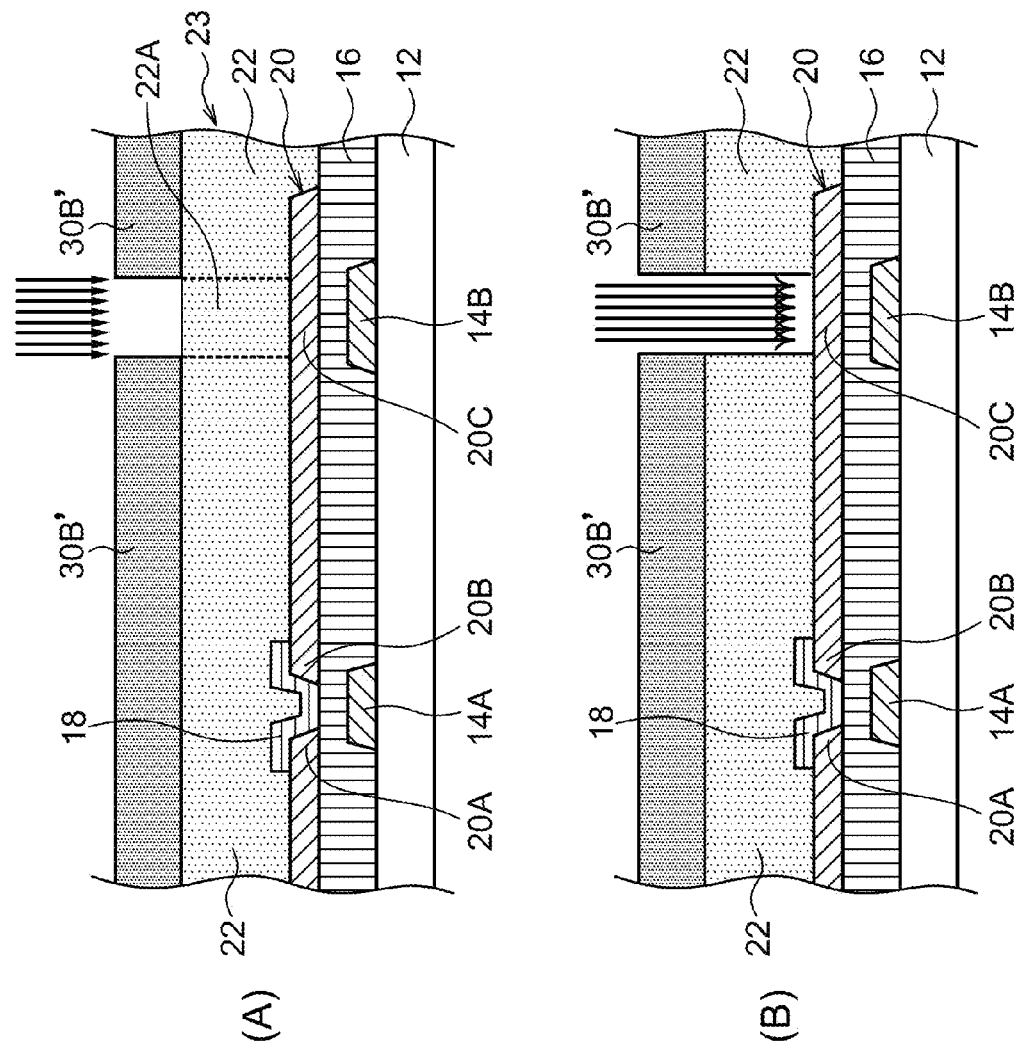
Figure 13:
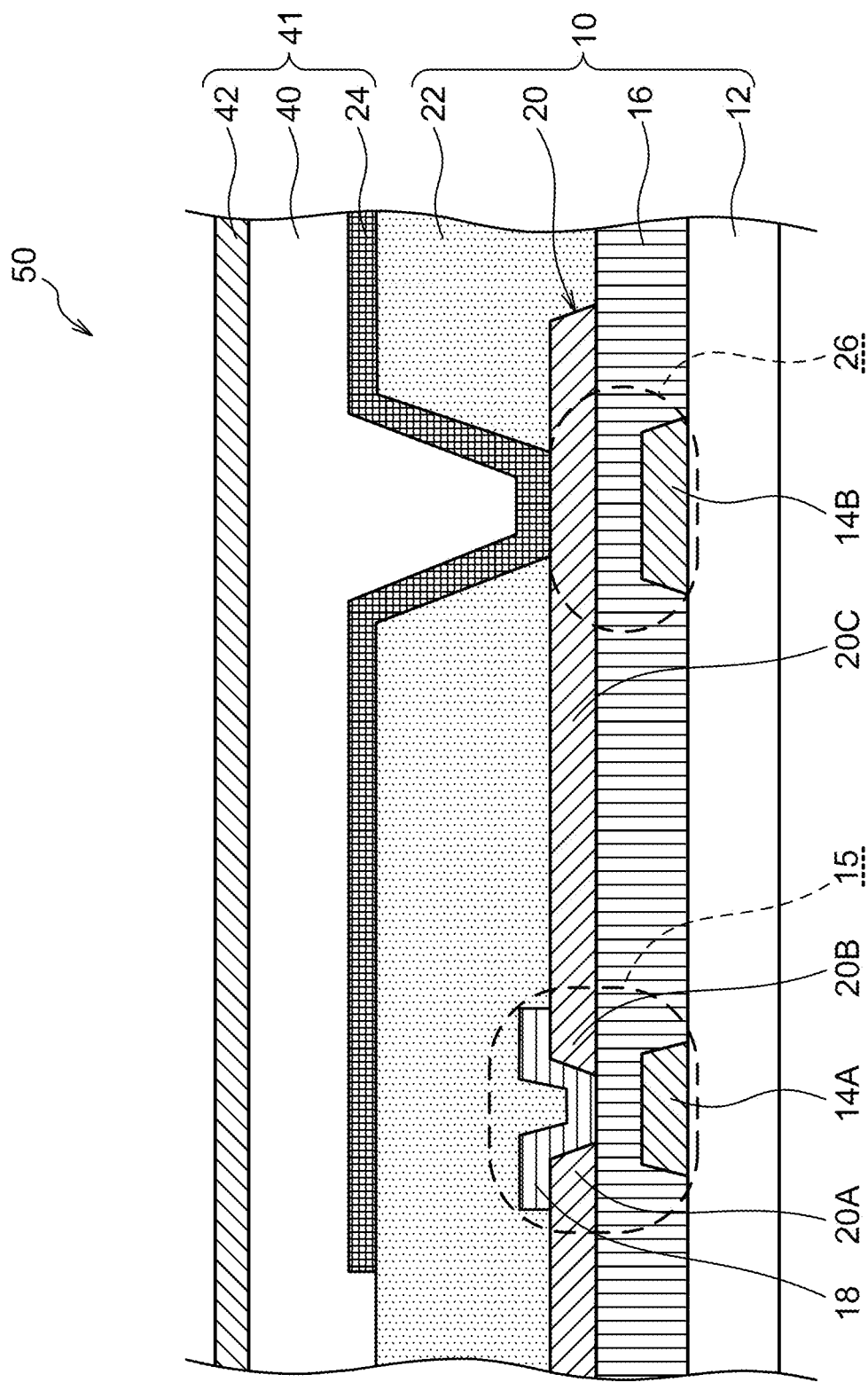
Figure 14:
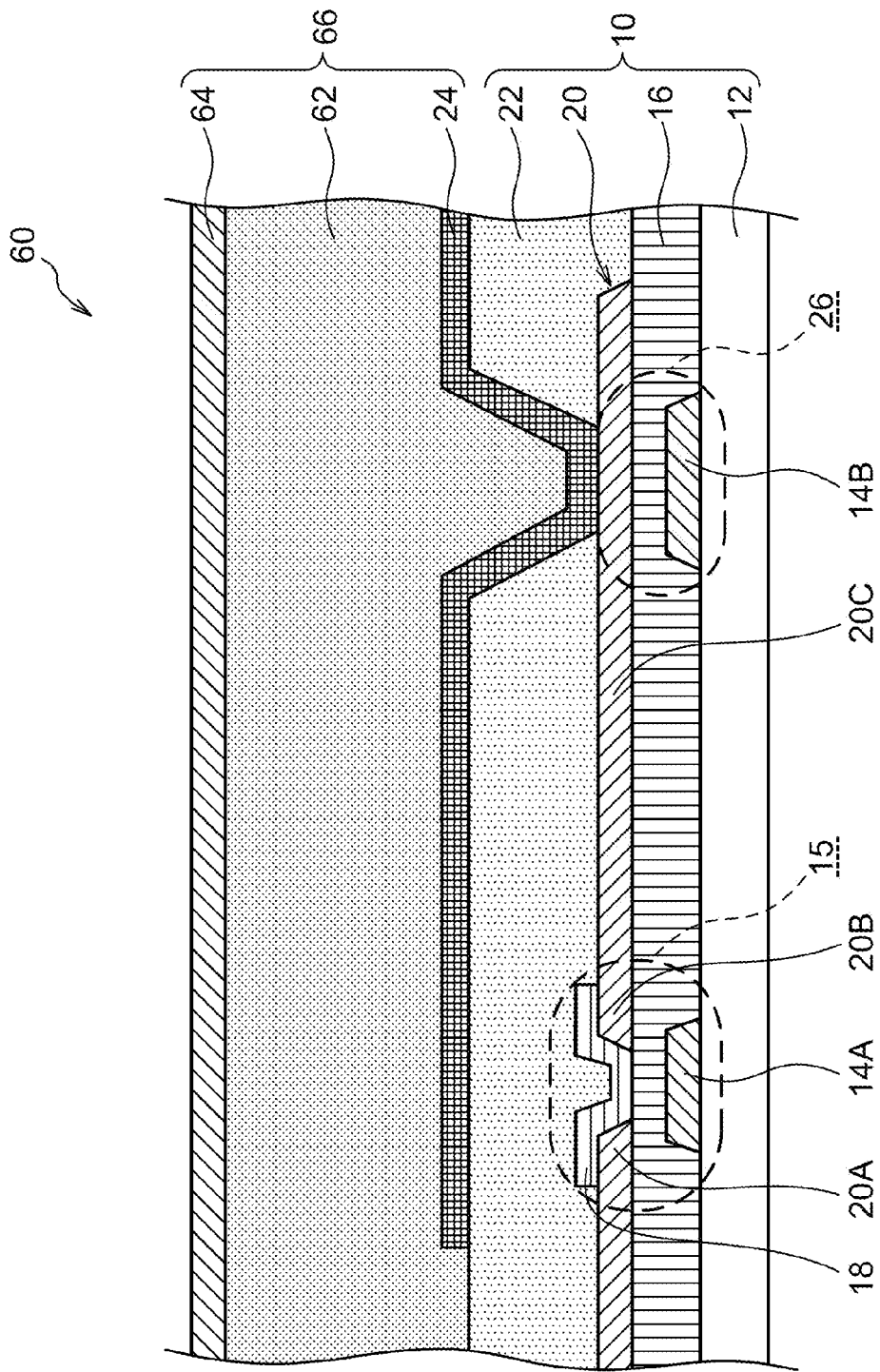

(A) to (D) of FIG. 3 each are a cross-sectional view schematically showing the processes of manufacturing the field-effect transistor according to the present exemplary embodiment, and (A) of FIG. 3 is a cross-sectional view along the line A-A' in FIG. 4, (C) of FIG. 3 is a cross-sectional view along the line A-A' in FIG. 5, and (D) of FIG. 3 is the cross-sectional view along the line A-A' in FIG. 6;

FIG. 4 is a plan view schematically showing the manufacturing process of a field-effect transistor according to the present exemplary embodiment;

FIG. 5 is a plan view schematically showing the process of manufacturing of the field-effect transistor according to the present exemplary embodiment;

FIG. 6 is a plan view schematically showing the process of manufacturing the field-effect transistor according to the present exemplary embodiment;

FIG. 7 is a plan view schematically showing the process of manufacturing the field-effect transistor according to the present exemplary embodiment;

(A) to (C) of FIG. 8 each are a cross-sectional view schematically showing the process of manufacturing the field-effect transistor according to the present exemplary embodiment, and (A) of FIG. 8 is the cross-sectional view along the line A-A' in FIG. 7;

(A) and (B) of FIG. 9 each are a cross-sectional view schematically showing the process of manufacturing a field-effect transistor according to the present exemplary embodiment;

FIG. 10 shows a cross-sectional view of the configuration of the field-effect transistor manufactured by the process of manufacturing the field-effect transistor according to the present exemplary embodiment, and the cross-sectional view along the line A-A' in FIG. 11;

FIG. 11 is a plan view schematically showing the configuration of the field-effect transistor manufactured by the process of manufacturing the field-effect transistor according to the present exemplary embodiment;

(A) and (B) of FIG. 12 each are a cross-sectional view schematically showing the processes of manufacturing the field-effect transistor according to the present exemplary embodiment, and the cross-sectional view showing processes different from those in FIG. 9;

FIG. 13 shows a cross-sectional view of the configuration of a display device to which the field-effect transistor according to the present exemplary embodiment is applied; and, FIG. 14 shows a cross-sectional view of the configuration of an electromagnetic wave detector to which the field-effect transistor according to the present exemplary embodiment is applied.

DETAILED DESCRIPTION OF THE INVENTION

Exemplary embodiments of a method of manufacturing a field-effect transistor of the invention, a field-effect transistor manufactured by the method of manufacturing the field-effect transistor of the invention are explained with reference to the drawings.

Figure 1:
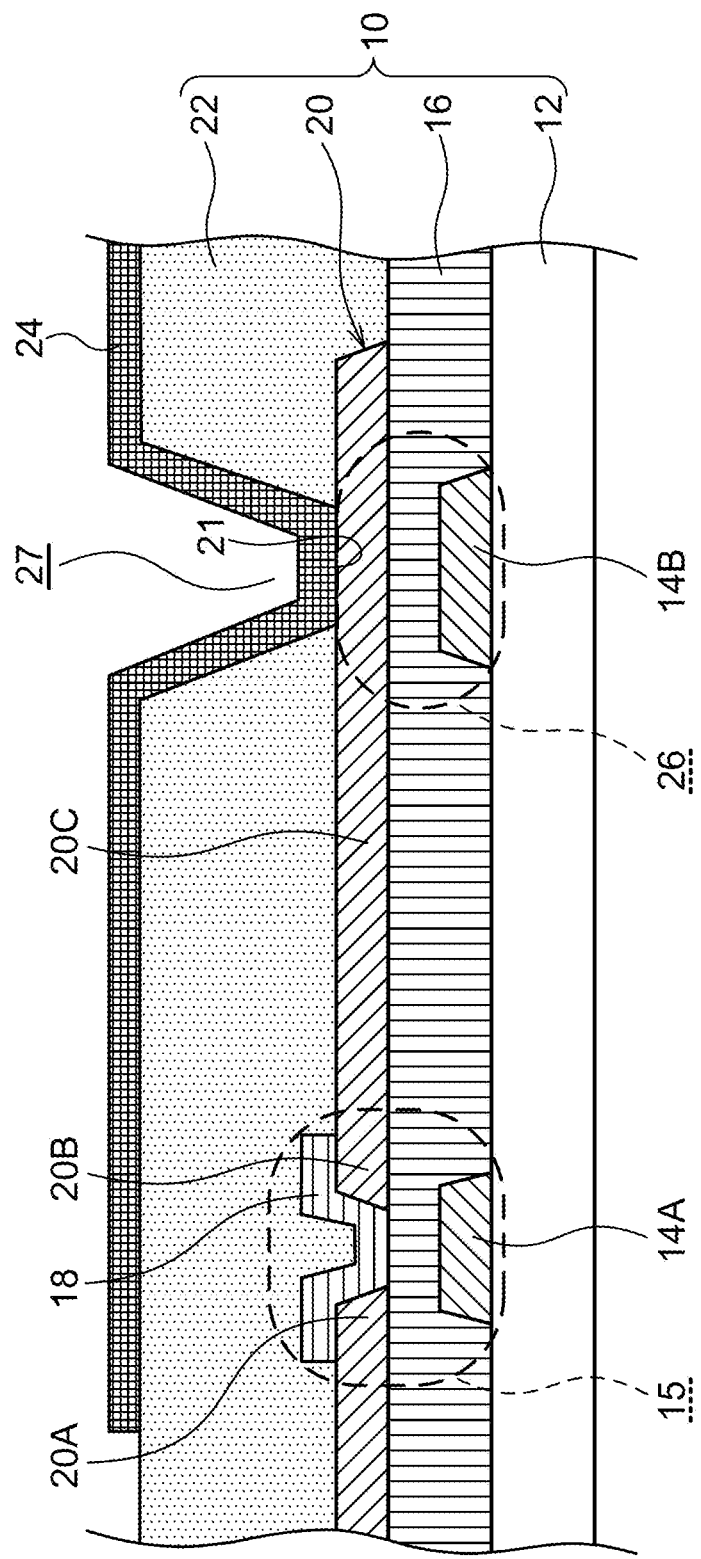
FIG. 1 is a schematic cross-sectional view showing a configuration of a field-effect transistor according to the present exemplary embodiment, and is a cross-sectional view along the line A-A' in FIG. 2.
Figure 2:
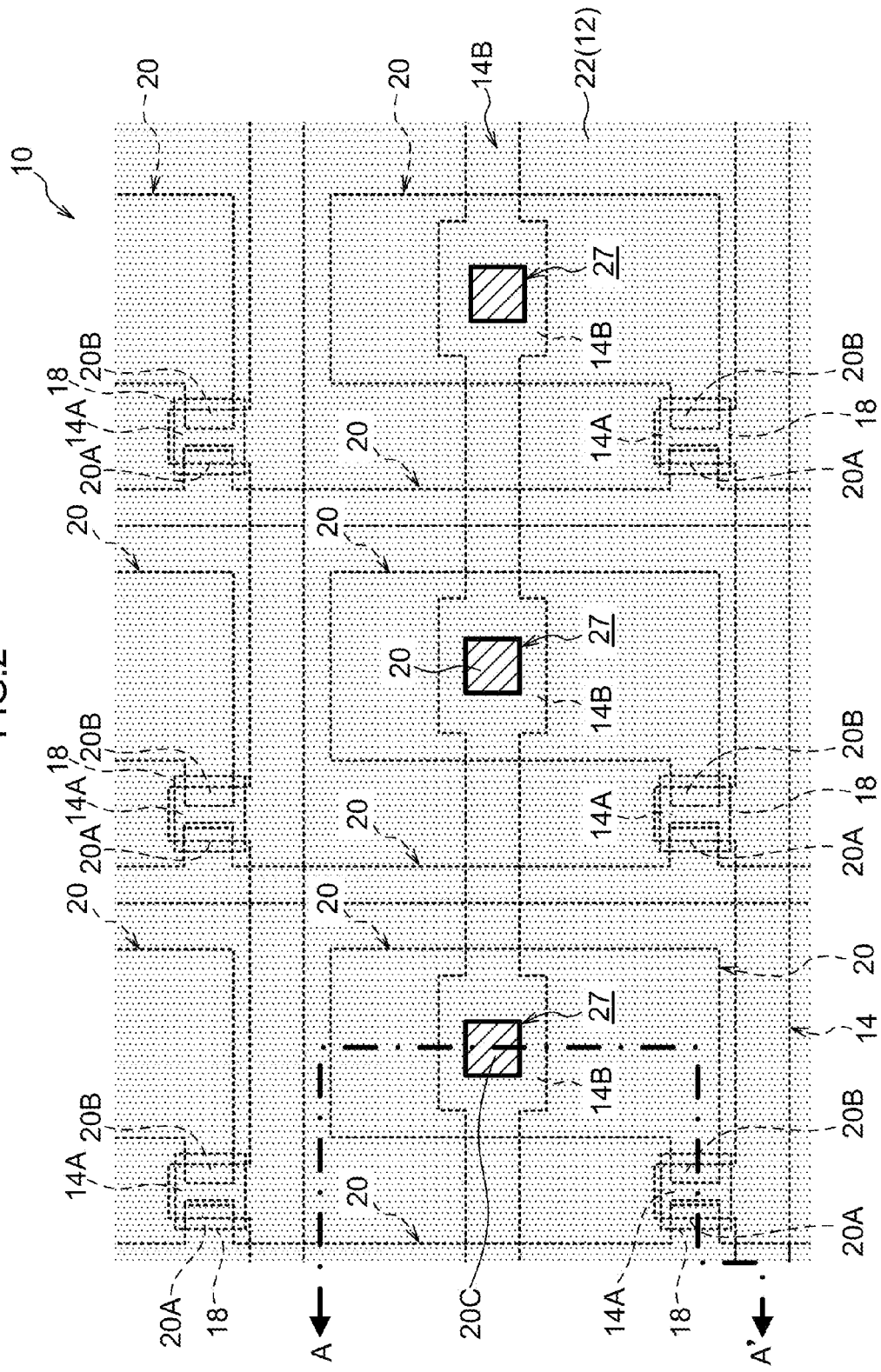
FIG. 2 is a plan view schematically showing a configuration of the field-effect transistor according to the present exemplary embodiment.

As shown in FIGS. 1 and 2, the field-effect transistor 10 of the present exemplary embodiment is constituted by laminating a gate electrode 14A, a lower electrode 14B, a gate insulating film 16, an electroconductive layer 20, an oxide semiconductor layer 18 and an inorganic insulating layer 22 on a substrate 12. The oxide semiconductor layer 18 functions as a channel layer for moving an electron or a hole. Parts of the electroconductive layer 20 each function as a source electrode 20A, a drain electrode 20B or a pixel electrode 20C.

Further, a transistor element 15 and a capacitor 26 are formed in the field-effect transistor 10 of the present exemplary embodiment. The transistor element 15 is formed of a gate electrode 14A, a gate insulating film 16, a source electrode 20A, the drain electrode 20B and an oxide semiconductor layer 18. The capacitor 26 is formed of the lower electrode 14B, an area of the pixel electrode 20C opposite to the lower electrode 14B and the gate insulating film 16. Accordingly, the gate insulating film 16 functions to insulate and separate the gate electrode 14A, and also functions as an integral capacitor in the capacitor 26.

For example, when the capacitor 26 is applied to various devices such as a display device, an electromagnetic wave detector or the like by arraying plural field-effect transistors 10 one-dimensionally or two-dimensionally, the capacitor 26 functions as a capacitor 26 corresponding to each pixel area (drive unit) by arranging each field-effect transistor 10 so as to correspond to each pixel area as a drive unit in the various kinds of devices. Specifically, when the capacitor 26 is applied to various devices such as a Tr-1C circuit structure having one field-effect transistor 10 and one capacitor in one pixel area, or 2Tr-1C circuit structure having two field-effect transistors 10 and one capacitor in one pixel area, the capacitor 26 functions as a capacitor 26 corresponding to each pixel area. A part of this pixel electrode 20 functions as an upper electrode corresponding to the lower electrode 14B which constitutes the capacitor 26.

That is, the pixel electrode 20C is an area including the area corresponding to the lower electrode 14B of the capacitor 26 in the electroconductive layer 20, and when the field-effect transistor 10 is applied to various devices, also functions as an electrode to contribute to the regulation of the size of the pixel area in the various devices.

In addition, in the present exemplary embodiment, although the field-effect transistor 10 is explained as a field-effect transistor having a capacitor 26, the field-effect transistor 10 may not have the capacitor 26 depending upon the structure or kinds of various devices to which the field-effect transistor 10. Further, in such a case, the pixel electrode 20C functions as a part of the source electrodes 20A or the drain electrodes 20B (a part of the drain electrodes 20B in FIG. 1).

The inorganic insulating layer 22 is formed so as to cover the upper side of the electroconductive layer 20 and the oxide semiconductor layer 18, so that the inorganic insulating layer 22 is adapted to protect and insulation-isolating the oxide semiconductor layer 18 and the electroconductive layer 20.

In addition, in the present exemplary embodiment, the "electroconductive", "electric conduction" and "electrode" mean that the volume resistivity is less than $10^{-2}$ Ω·cm, and the "insulative" and "insulation" mean that the volume resistivity is $10^{10}$ Ω·cm or more.

A contact hole 27 is formed in the inorganic insulating layer 22. The contact hole 27 is formed in order to expose a part of the electroconductive layer 20 which is contiguous with the lower side (substrate 12 side) of the inorganic insulating layer 22. When the field-effect transistor 10 is applied to various devices such as a display device, an electromagnetic wave detector or the like, which will be described later, it is necessary to electrically connect the electroconductive layer 20 to each element in these various devices through the exposed area of the electroconductive layer 20. For this reason, when the field-effect transistor 10 is applied to the various devices above, an electrode layer 24 is formed on the inorganic insulating layer 22 in which the contact hole 27 is formed, and the electrode layer 24 and the electroconductive layer 20 are electrically connected via the exposed area 21 in the electroconductive layer 20.

In addition, in the present exemplary embodiment, the contact hole 27 is formed in the area opposite to the lower electrode 14B. For this reason, in the present exemplary embodiment, by forming the contact hole 27 in the inorganic insulating layer 22, the areas opposite to the lower electrode 14B in the entire areas of the upper surface side of the electroconductive layer 20 (opposite surface from the substrate 12) is exposed from the inorganic insulating layer 22.

In the present exemplary embodiment, as described above, although the case where the contact hole 27 is formed in the area where the contact hole 27 is opposite to the lower electrode 14B, is explained, the contact hole 27 is not limited to such a position, provided that the contact hole 27 is formed such that a partial area of the electroconductive layer 20 is exposed from the inorganic insulating layer 22, but the position of the contact hole 27 may be suitably adjusted in accordance with the configuration or kinds of various devices to which the field-effect transistor 10 is applied.

Further, although the case where a bottom contact type in which the oxide semiconductor layer 18 is in contact with the source electrode 20A and the drain electrode 20B at the lower surface side (substrate 12 side) of the oxide semiconductor layer 18 in the field-effect transistor 10 in the present exemplary embodiment is explained, a top contact type in which the oxide semiconductor layer 18 is in contact with the source electrode 20A and the drain electrode 20B at the upper surface side (the side opposite from substrate 12) of the oxide semiconductor layer 18 may be used.

The field-effect transistor 10 constituted as described above, is an active element which functions switching the current between the electrodes of the source electrode 20A and the drain electrode 20B by controlling the current which flows in the oxide semiconductor layer 18 by applying a voltage to the gate electrode 14A.

Examples of materials for constituting the substrate 12 include, for example, inorganic materials such as glass. YSZ (zirconia stabilized yttrium) or the like; and organic materials including polyesters such as polyethylene terephthalate, polybutylene terephthalate or the like; polystyrene, polycarbonate, polyether sulfone, polyarylate, allyldiglycol carbonate, polyimide, polycycloolefin, norbornene resin, and poly (chlorotrifluoroethylene) or the like. When the organic materials described above are used as the materials for forming the substrate 12, it is preferable that materials excellent in heat resistance, dimensional stability, resistance to solvents, electric insulating property, workability, low gas permeability, low hygroscopicity and the like be selected.

The substrate 12 is preferably flexible. From the viewpoint of the flexibility, it is preferable to use an organic plastic film prepared by forming the organic materials in a film shape. Further, in the case where the insulating performance of the substrate 12 is insufficient, the substrate 12 may be provided with an insulating layer, or the substrate 12 may have a configuration in which a gas-barrier layer for preventing moisture and oxygen from penetrating into the substrate may be formed, or an undercoat layer for enhancing the planarity of the film-shaped plastic substrate, or the adhesiveness with the electrode or the oxide semiconductor layer is laminated.

The thickness of the substrate 12 is preferably set to 50 μm to 500 μm. When the thickness of the substrate 12 is 50 μm or more, the substrate 12 itself can maintain sufficient flatness. When the thickness of the substrate 12 is 500 μm or lower, the substrate 12 itself can be freely bent, i.e., the flexibility of the substrate 12 itself becomes favorable.

Preferable examples of materials of forming the gate electrode 14A and the lower electrode 14B include metals such as Al, Mo, Cr, Ta, Ti, Au, Ag or the like; alloys such as Al—Nd, APC or the like; metal oxide electroconductive films such as tin oxide, zinc oxide, indium oxide, indium tin oxide (ITO), indium zinc oxide (IZO) or the like; organic electroconductive compounds such as polyaniline, polythiophene, polypyrrole or the like; or the mixtures and alloys thereof. The thickness of the gate electrode 14A is preferably 10 nm to 1,000 nm.

As the gate insulating film 16, insulators such as $SiO_2$, $SiN_x$, SiON, $Al_2O_3$, $Y_2O_3$, $Ta_2O_5$, $HfO_2$ or the like, the mixed crystal compounds containing at least two compounds or more of these compounds are used. Further, polymer insulators such as polyimide or the like are also used as the gate insulating film 16.

The film thickness of the gate insulating film 16 is preferably from 10 nm to 10 μm. It is necessary that the film thickness of the gate insulating film 16 be increased to some extent, in order to reduce leak current and to increase the withstand voltage. However, the increase in the film thickness of the gate insulating film 16 results in an increase in the drive voltage of the field-effect transistor 10. For the reason, when the gate insulating film 16 is formed from an inorganic insulator, the gate insulating film 16 having a thickness of from 50 nm to 1,000 nm is preferably used, and when the gate insulating film 16 is formed from a polymer insulator, the gate insulating film 16 having a thickness of from 0.5 μm to 5 μm is preferably used. In particular, when a high dielectric insulator such as $HfO_2$ is used as the gate insulating film 16, such an insulator is preferably used because the drive of the field-effect transistor 10 can be possible at low voltage, even if the film thickness is increased.

Preferable examples of materials of forming the electroconductive layer 20 (the source electrode 20A, the drain electrode 20B and the pixel electrode 20C) include metals such as Al, Mo, Cr, Ta, Ti, Au, Ag or the like; alloys such as Al—Nd, APC or the like; metal oxide electroconductive film such as tin oxide, zinc oxide, indium oxide, indium tin oxide (ITO), indium zinc oxide (IZO) or the like; organic electroconductive compounds such as polyaniline, polythiophene, polypyrrole or the like; or the mixtures and alloys thereof. In particular, IZO, ITO or the like are suitably used by reason of forming a good ohmic contact with the oxide semiconductor. The layer thickness of the electroconductive layer 20 to be formed is desirably from 10 nm to 1,000 nm.

The oxide semiconductor layer 18 contains an oxide semiconductor as a main component. In addition, the main component means that the content in the constituent components in the oxide semiconductor layer 18 is the largest, and is preferably 50% by mass or more. Since the oxide semiconductor is capable of forming a film at low temperatures, the oxide semiconductor can suitably be formed in a film shape on a flexible substrate 12.

The oxide semiconductor used for the oxide semiconductor layer 18 is preferably an amorphous oxide compound containing at least one element selected from the group consisting of In, Zn, Ga, Sn and Cd, and is more preferably an amorphous oxide compound containing at least one element selected from the group consisting of In, Zn and Ga.

Specifically, examples of the amorphous oxides used for the oxide semiconductor layer 18 include an amorphous semiconductor represented by $InGaO_3(ZnO)_m$ (m is a natural number less than 6), $ZnO \cdot Rh_2O_3$, $CuGaO_2$, $SrCu_2O_2$, and the oxide semiconductor disclosed in JP-A No. 2006-165529 and the like as the composition structure.

Among them, as the amorphous oxide semiconductor used in the oxide semiconductor layer 18, the amorphous semiconductor represented by $InGaO_3(ZnO)_m$ (m is a natural number less than 6) is suitably used. In the oxide semiconductors whose composition in the crystallized state is represented by $InGaO_3(ZnO)_m$ (m is a natural number less than 6), in particular, $InGaZnO_4$ is more desirable. The oxide semiconductors having this composition have a tendency to increase the electron mobility with an increase in the electroconductivity.

The electroconductivity of the oxide semiconductor layer 18 is preferably from $10^{-4}$ $Scm^{-1}$ to less than $10^2$ $Scm^{-1}$, and is more preferably from $10^{-1}$ $Scm^{-1}$ to less than $10^2$ $Scm^{-1}$. Examples of the methods of adjusting the electroconductivity of the oxide semiconductor layer 18 include known an adjustment method by using oxygen defect, an adjustment method with composition ratio, an adjustment method with impurity and adjustment method with an oxide semiconducting material.

The inorganic insulating layer 22 is a layer which contains an inorganic material as a main component and is insulating. Since the inorganic insulating layer 22 is a layer which contains an inorganic material as a main component, for example, a film formation using a sputtering method is feasible, and a uniform (deviation of layer thickness is within ±10% from the average layer thickness) and thin (preferably, 500 nm or less) inorganic insulating layer 22 can be formed.

Further, the inorganic insulating layer 22 can be processed by using wet etching. That is, the inorganic insulating layer 22 is soluble in an etching liquid used at the time of forming a contact hole 27. In addition, that the inorganic insulating layer 22 is soluble in the etching liquid means preferably that the dissolution rate of the constituent material of the inorganic insulating layer in the etching liquid at 25° C. is 1 nm/s or more.

In order to dissolve the inorganic insulating layer 22 in the etching liquid, the constituent material of the inorganic insulating layer 22 containing an inorganic material as a main component and the kind of etching liquid (details will be describe later) are appropriately selected.

Although the constituent material of the inorganic insulating layer 22 may be any material as long as the material satisfies the characteristics above, $Ga_2O_3$ as a Ga-containing oxide is preferably used.

By forming the inorganic insulating layer 22 with a Ga-containing oxide, easy processing by wet etching using chemicals with less toxicity is feasible as compared with the case where $SiO_2$ is used as an inorganic insulating layer 22 in prior art. Further, since the processing with wet etching is feasible, erosion and damage of the electroconductive layer 20 at the time of processing of the inorganic insulating layer 22 (at the time of forming the contact hole 27) can be suppressed.

Moreover, since the inorganic insulating layer 22 becomes alkali soluble by forming the inorganic insulating layer 23 by a Ga-containing oxide, an alkaline etching liquid as an etching liquid which is used for the processing of the inorganic insulating layer 22 can be used, and even if an material (for example, IZO suitably used as the electroconductive layer 20) with low acid-resistance as the electroconductive layer 20 is used, the inorganic insulating layer 23 can be processed without the electroconductive layer 20 being eroded.

Further, the constituent material of the inorganic insulating layer 22 is desirably amorphous. Good solubility of the inorganic insulating layer 22 in the etching liquid used at the time of processing by wet etching, which will be described later, can be realized, when the constituent material of the inorganic insulating layer 22 is amorphous.

In addition, in the manufacture of the field-effect transistor 10 in the present exemplary embodiment, the developer used for developing the photoresist film 30 (refer to (B) of FIG. 8; details will be described later) formed on the inorganic insulating layer 23 is used as an etching liquid for the inorganic insulating layer 22. For this reason, in the present exemplary embodiment, as the etching liquid used for processing of the inorganic insulating layer 22, a liquid which is also applicable to the developer used for the development of the photoresist film 30 is selected (details will be described later).

The layer thickness of the inorganic insulating layer 22 may be any thickness to such a degree that the insulating layer 22 does not inhibit the function to protect the oxide semiconductor layer 18 and the electroconductive layer 20 (the area other than the area to be exposed in the process, which will be described later), and does not inhibit the function to insulating and separating the electrode layer 24 from the electroconductive layer 20 when the electrode layer 24 is formed on the inorganic insulating layer 22. For example, the layer thickness of the inorganic insulating layer 22 is preferably from 20 nm to 500 nm, and more preferably from 30 nm to 100 nm.

The field-effect transistor 10 formed from the constituent materials above is manufactured through an electroconductive layer-forming process, an oxide semiconductor layer-forming process, an inorganic insulating layer-forming process, a resist-forming process, an exposure process and a developing process (a resist pattern forming process and a processing process).

Hereinafter, the method of manufacturing the field-effect transistor 10 formed from the constituent materials above is explained in detail.

(1) Electroconductive Layer-Forming Process

In the electroconductive layer-forming process, a laminate 10A (refer to (C) of FIG. 3) is formed by laminating a gate electrode 14A and a lower electrode 14B, a gate insulating film 16 and an electroconductive layer 20 in this order on a substrate 12.

First, as shown in (A) of FIG. 3 and FIG. 4, an electrode layer 14 including the gate electrode 14A and the lower electrode 14B is formed in such a manner that constituent materials of the gate electrode 14A and the lower electrode 14B are formed in a layer, and the layer is patterned. Next, as shown in (B) of FIG. 3, a gate insulating film 16 is formed in a layer on the thus formed electrode layer 14 including the gate electrode 14A and the lower electrode 14B. As the method of forming the layers formed from the constituent materials of the gate electrode 14A and the lower electrode 14B, and the gate insulating film 16 in layers, known methods are used without specific limitations, but a method may be suitably selected from methods including a wet method such as a printing method, a coating method or the like; a physical method such as a vacuum deposition method, a sputtering method, an ion-plating method or the like; and a chemical method such as a CVD, a plasma CVD or the like; in consideration of the suitability with the materials for forming each layer.

For example, as a material which constitutes the gate electrode 14A and the lower electrode 14B, when ITO is selected, as the film-forming method of the layer by using such constituent material, a direct current or high-frequency sputtering method, a vacuum deposition method, an ion-plating method and the like are selected. Further, as a material which constitutes the gate electrode 14A and the lower electrode 14B, when an organic electroconductive compound is selected, as the film-forming method, a wet film-forming method is selected. Moreover, as the patterning method of the layer formed from the constituent material of the gate electrode 14A and the lower electrode 14B, known methods may be used, and for example, a photolithographic method and an etching method are used.

Next, by forming an electroconductive layer (illustration is omitted) in a film and patterning the layer, a layer 20 having a source electrode 20A, a drain electrode 20B and a pixel electrode 20C is formed on the gate insulating film 16 (refer to (C) of FIG. 3 and FIG. 5).

The method of forming this electroconductive layer (the electroconductive layer 20 before being patterned, illustration is omitted) is not specifically restricted, but a method may be suitably selected from methods including a wet method such as a printing method, a coating method or the like; a physical method such as a vacuum deposition method, a sputtering method, an ion-plating method or the like; and a chemical method such as a CVD, a plasma CVD or the like; in accordance with the materials to be selected as the electroconductive layer 20. For example, when ITO as the electroconductive layer 20 is selected, a direct current or high-frequency sputtering method, a vacuum deposition method or an ion-plating method is suitably used. Further, when an organic electroconductive material is used as the material of forming the electroconductive layer 20, the electroconductive layer 20 is suitably formed by using a wet film-forming method.

As the method of patterning the electroconductive layer formed in a layer (the electroconductive layer 20 before being patterned), known methods may be used. For example, a resist pattern is formed by a photolithographic method on the film-formed electroconductive layer on the gate insulating film 16, and the area in the electroconductive layer is not protected by the resist pattern is removed by wet etching, so that partial areas of the electroconductive layer are formed as the source electrode 20A and a drain electrode 20B, thereby forming electroconductive layer 20. Further, the area corresponding to the lower electrode 14B in the electroconductive layer 20 functions as the pixel electrode 20C.

(2) Oxide Semiconductor Layer-Forming Process

In the oxide semiconductor layer-forming process, as shown in (D) of FIG. 3 and FIG. 6, an oxide semiconductor layer 18 is formed so as to cover the source electrode 20A and a drain electrode 20B formed in the electroconductive layer-forming process, and the space between the source electrode 20A and a drain electrode 20B.

In the oxide semiconductor layer-forming process, the oxide semiconductor layer 18 is formed in such a manner that the constituent materials of the oxide semiconductor layer 18 is formed in a layer (illustration is omitted) on the gate insulating film 16 and the electroconductive layer 20, and the layer is patterned.

As the film-forming method of the layer by using the constituent materials of the oxide semiconductor layer 18, it is desirable to use a vapor phase film-forming method in which the polycrystalline sintered body of the amorphous oxide semiconductor that forms the oxide semiconductor layer 18 as described above is used as a target. Further, in the vapor phase film-forming method, the sputtering method and the pulse laser vapor-deposition method (PLD method) are suitable. Further, from the viewpoint of mass-productivity, the sputtering method is desirable. The oxide semiconductor layer 18 is formed in a film, for example, by controlling the degree of vacuum and the flow rate of oxygen by an RF magnetron sputtering vapor-deposition method. When this method is used, the electroconductivity of the oxide semiconductor layer 18 formed can be smaller with an increase in the flow rate of oxygen. In addition, the oxide semiconductor layer 18 which is film-formed can be determined whether the film is an amorphous film by well-known X-ray diffraction method. Moreover, the film thickness of the oxide semiconductor layer 18 can be obtained by stylus surface profile measurement. The composition ratio can be obtained by the RBS (Rutherford backscattering) spectrometric method.

Next, by patterning the layer formed by the constituent materials of the oxide semiconductor layer 18, the oxide semiconductor layer 18 is formed, as shown in (D) in FIG. 3 and FIG. 6.

Known methods are used as the patterning method, and, for example, a resist pattern is formed on the layer by using the constituent material of the oxide semiconductor layer 18 by a photolithographic method, and the oxide semiconductor layer 18 is formed by removing the area where the layer is not protected by the resist pattern by wet etching.

(3) Inorganic Insulating Layer-Forming Process

In the inorganic insulating layer-forming process, as shown in FIG. 7 and (A) of FIG. 8, an inorganic insulating layer 23 is formed so as to cover the electroconductive layer 20 and the oxide semiconductor layer 18 formed in the process above.

The inorganic insulating layer 23 which is processed (etched) in the developing process or a processing process, which will be described later, functions as an inorganic insulating layer 22 having a contact hole 27, when the etched inorganic insulating layer 23 is constituted as a field-effect transistor 10.

As the film-forming method of the inorganic insulating layer 23, it is preferable to use a polycrystalline sintered body of the constituent materials that constitutes the inorganic insulating layer 22 as described above as a target. Further, in the vapor phase film-forming method, the sputtering method and the pulse laser vapor-deposition method (PLD method) are suitable. In particular, in view of mass-productivity, and uniform and thin film formation, the sputtering method is desirable. In addition, when the inorganic insulating layer 22 is formed from an amorphous inorganic material, as to whether the formed inorganic insulating layer 22 in a film shape is amorphous may be determined by well-known X-ray diffraction method. Moreover, the film thickness of the inorganic insulating layer 22 can be obtained by stylus surface profile measurement.

(4) Resist-Forming Process

In the resist-forming process, as shown in (B) of FIG. 8, a photoresist film 30 is formed on the inorganic insulating layer 23 formed in the inorganic insulating layer-forming process above. The photoresist film 30 is formed by applying a photoresist on the inorganic insulating layer 23. The photoresist only needs to have characteristics such that the photoresist can be dissolved in the developer used for the development of the photoresist film 30 formed by the photoresist, and may be a positive-working photoresist whose exposed area is removed by development, or may be a negative-working photoresist whose unexposed area is removed by development.

In the present exemplary embodiment, an embodiment, in which a positive-working photoresist is used, is explained as an example.

As the photoresist, a photosensitive resin composition which is sensitive to radiant rays such as ultraviolet rays (g-line, i-line), far ultraviolet rays including an excimer laser and the like, electron rays, ion beams or X-rays, is used.

Specifically, as the positive-working photoresist, when an alkaline developer is used as a developer, a composition containing a quinonediazide compound and an alkali soluble resin is desirable. The composition containing a quinonediazide compound and alkali soluble resin is used as a positive-working photoresist by utilizing the characteristics such that when the composition is irradiated with light having wavelengths of 500 nm or less, a quinonediazide group is decomposed to produce a corboxy group, and as a result, the photoresist becomes alkali-soluble from alkali-insoluble state. Since the resolving power of the photosensitive resin composition is remarkably excellent, the photosensitive resin composition is used for production of integrated circuits such as an IC or an LSI. The quinonediazide compound is exemplified by a naphthoquinonediazide compound.

(5) Exposure Process

In the exposure process, the photoresist film 30 formed on the inorganic insulating layer 23 in the resist-forming process above is pattern-exposed through a photomask in a pattern shape, and thereafter, the portions where the resist film is not irradiated with light are additionally heated to be cured.

Namely, in this exposure process, as shown in (C) of FIG. 8, the area 30B where the resist film 30 is not irradiated with light is cured, and the area 30A where the resist film 30 is irradiated with light becomes an uncured state (soluble state in a developer).

As the light used for the pattern exposure to the photoresist film 30, for example, ultraviolet rays, far ultraviolet rays, electron beams, ion beams, radiation rays, and the like, to which the photoresist film 30 is sensitive, are used.

(6) Developing Process

In the developing process, the photoresist film 30 which has been exposed through the exposure process is developed using a developer and forms a resist pattern 30B' corresponding to the area 30B of the photoresist film 30, and the inorganic insulating layer 23 is processed by wet etching using the developer as an etching liquid, thereby forming a contact hole 27.

Specifically, by developing the photoresist film 30 with the developer, as shown in (A) of FIG. 9, the area (area 30A irradiated with light in the case of a positive-working photoresist) in the photoresist film 30 where the photoresist film is changed to a soluble state in the developer through the exposure process is removed, and the area 30B where the photoresist film is not irradiated with light in the exposure process is left as a resist pattern 30B', so that a state where the area 22A other than the area (inorganic insulating layer 22) is contiguous with the resist pattern 30B' of the inorganic insulating layers 23 becomes exposed on the surface, is formed.

The developer used for the development of the photoresist film 30 also serves as an etching liquid, and the inorganic insulating layer 23 (refer to (B) of FIG. 9) is processed by wet etching, thereby forming a contact hole 27.

In the present exemplary embodiment, as described above, since the inorganic insulating layer 23 is soluble in the developer used for the development of the photoresist film 30, by using the developer also as an etching liquid, the exposed area 22A is removed by the etching liquid, thereby forming the contact hole 27. Further, since the developer is used also as the etching liquid, the development of the photoresist film 30 and the wet etching of the inorganic insulating layer 23 can be performed in one step.

Here, as described above, in the present exemplary embodiment, the developer used for the development of the photoresist film 30 is used as the etching liquid used for the wet etching of the inorganic insulating layer 23, therefore, as the developer used in this developing process, any developer may be used as long as the photoresist film 30 is developable, the inorganic insulating layer 23 is soluble, and the electroconductive layer 20 is insoluble, and such a developer may be suitably selected in accordance with the constituent materials of the photoresist film 30, the inorganic insulating layer 23 and the electroconductive layer 20. In addition, that the electroconductive layer 20 is insoluble means that the rate of dissolving the constituent material of the electroconductive layer 20 is 0.2 nm/s or less in the developer (etching liquid) at a liquid temperature of 25° C.

For example, suppose that the inorganic insulating layer 23 is formed from a material (for example, $Ga_2O_3$) which is alkali soluble. Further, suppose that a material is selected such that the area to be removed by the pattern exposure in the exposure process of the photoresist is alkali-soluble, and the area to be left is alkali-resistant. Furthermore, suppose that an alkali-resistant material is used as the electroconductive layer 20. In the case of this combination, as the developer and the etching liquid used in the developing process, an alkaline etching liquid may be used.

As a material used for the electroconductive layer 20, a material such as amorphous IZO or the like which is weak against an acid is suitably used, and therefore, as the etching liquid (used also as a developer in the present exemplary embodiment) for the inorganic insulating layer 23, it is preferable to use an alkaline etching liquid.

For example, examples of the alkaline etching liquid include an aqueous solution containing sodium hydroxide, potassium hydroxide, sodium carbonate, sodium silicate, sodium metasilicate, aqueous ammonia, ethylamine, diethylamine, dimethyl ethanolamine, tetramethylammonium hydroxide, tetraethylammonium hydroxide, choline, pyrrole, piperidine and 1,8-diazabicyclo[5,4,0]-7-undecene.

Examples of the developing method used in the developing process include a dip method, a spray method, a paddle method and the like. The development temperature is preferably from 15° C. to 40° C. Further, in general, washing is preformed with running water after the development.

Next, the resist pattern 30B' is stripped from the inorganic insulating layer 22. Although the method of stripping the resist pattern 30B' may be any method as long as the resist pattern 30B' can be stripped from the inorganic insulating layer 22, a method in which the resist pattern 30B is dissolved and removed, or a method using ultrasonic wave, ashing or the like may be suitably used.

As the stripping liquid used for dissolving and removing the resist pattern 30B', any liquid which does not dissolve the inorganic insulating layer 22 and the electroconductive layer 20, and can dissolve the resist pattern 30B' may be used, and may be suitably selected in accordance with the constituent materials of the inorganic insulating layer 22 and the electroconductive layer 20, and the constituent materials of the resist pattern 30B'. In the present exemplary embodiment, for example, a neutral stripping liquid is suitably used.

In addition, the resist pattern 30B' is not necessarily to be stripped, but may be left intact, without being stripped.

After the developing process, a post-baking processing is performed, if needed. The post-baking is a process for the purpose of tapering the shape of the contact hole 27 in the inorganic insulating layer 22 with thermal deformation, and in general, heating (generally, from about 200° C. to 220° C.) (hard-baking) is performed. The heating is carried out by a continuous system or a batch system using a heating unit such as a hot plate, a convection oven (hot air circulation dryer), a high frequency heating machine or the like.

In the above process, since the periphery of the bottom of the contact hole 27 in the inorganic insulating layer 22 can be tapered, it may be said that the periphery of the bottom of the contact hole 27 can be easily tapered as compared with the lift-off method used at the time of the conventional processing of the inorganic insulating layer 22.

In addition, the taper angle of the periphery of the bottom of the contact hole 27 in the inorganic insulating layer 22 is easily adjusted in accordance with the baking temperature conditions at the time of the post-baking above, or the temperature conditions of the developer (etching liquid), and, for example, the temperature is adjusted to a temperature of from 30° C. to 80° C.

By the processes as describe above, the field-effect transistor 10 is manufactured as shown in FIG. 10 and FIG. 11.

In addition, when the field-effect transistor 10 is applied to various devices, which will be described later, an electrode layer 24 may be formed on the inorganic insulating layer 22 in the electrode layer-forming process.

As the film-forming method and the patterning method of the electrode layer 24, known methods may be used, and, for example, the film-forming method and the patterning method of the electroconductive layer 20 may be used.

The constituent materials of the electrode layer 24 only need to have the electroconductivity, and may be appropriately selected in accordance with various devices to which the field-effect transistor 10 is applied. For example, examples of the materials include metals such as Al, Mo, Cr, Ta, Ti, Au, Ag or the like; alloys such as Al—Nd, APC or the like; metal oxide electroconductive films such as tin oxide, zinc oxide, indium oxide, indium tin oxide (ITO), indium zinc oxide (IZO), or the like; organic electroconductive compounds such as polyaniline, polythiophene, polypyrrole or the like; and the mixtures or alloys thereof.

Among them, a metal oxide such as IZO or ITO is preferable, because when such a metal oxide such as IZO or ITO is used as a main component, the electrode layer 24 can be transparent (transmittance to visible light is 50% or more). For example, when the field-effect transistor 10 is applied to an electromagnetic wave detector, which will be described later, by making the electrode layer 24 transparent, it is preferable that the backlight irradiation for afterimage-erasing (details will be described later) become feasible, and detection performance be improved.

In addition, that the metal oxide is a main component, means that the content is the largest in the constituent components of the electrode layer 24, and by making metal oxide into the main component, and consequently, means the content becomes to such a degree that the electrode layer 24 becomes transparent, and preferably 50% by mass or more.

As described above, according to the method of manufacturing the field-effect transistor 10 of the present exemplary embodiment, on the electroconductive layer 20 including the source electrode 20A, the drain electrode 20B and the pixel electrode 20C manufactured in the electroconductive layer-forming process, the inorganic insulating layer 23 containing an inorganic material as a main component is formed so as to cover the electroconductive layer 20 and the oxide semiconductor layer 18. And, after the photoresist film 30 is formed on the inorganic insulating layer 23 and is exposed in a pattern shape, in the developing process, the resist pattern 30B' is formed by developing the exposed photoresist film by using a developer. Further, in the developing process, by using this developer as an etching liquid, a part of the electroconductive layer 20 is exposed by removing the area exposed from the resist pattern 30B' in the inorganic insulating layers 23, thereby forming a contact hole 27 in the inorganic insulating layer 22.

In this way, according to the method of manufacturing the field-effect transistor 10 of the present exemplary embodiment, the inorganic insulating layer 23 is made into the insulating layer containing the inorganic material as a main component, and the inorganic insulating layer 23 is processed with wet etching using an etching liquid, so that the contact hole 27 is formed by exposing a part of the electroconductive layer 20 formed at the lower layer side of the inorganic insulating layer 23, thereby preventing the electroconductive layer 20 from eroding and breaking at the time of forming the contact hole 27.

Specifically, in this process, the processing accuracy is higher as compared with the case where a contact hole 27 is formed in the inorganic insulating layer 23 by a lift-off process, and debris are rarely generated, thereby obtaining high yield. Further, since the edge (the periphery at bottom of the contact hole) of the area where the contact hole 27 in the inorganic insulating layer 22 is formed can be easily tapered, this process is suitable for forming the contact hole 27.

Furthermore, since the contact hole 27 is formed by processing the inorganic insulating layer 23 by wet etching, and the cost of the equipment is low as compared with the dry etching method, thereby attaining the cost reduction.

Further, since the inorganic insulating layer 22 is a layer which contains an inorganic material as a main component, the film-formation utilizing a sputtering method is feasible, and a uniform and thin inorganic insulating layer 22 can be formed.

Moreover, as described above, since an alkaline etching liquid is desirably used as the etching liquid, when the alkaline etching liquid is used as the etching liquid, even if the electroconductive 20 is formed from materials such as an amorphous ITO or the like which is weak against an acid, erosion of the electroconductive layer 20 at the time of forming contact hole 27 is suppressed.

In addition, in the method of manufacturing the field-effect transistor 10 of the present exemplary embodiment, the case where the developer used for the development of the resist pattern 30B' in the developing process is applied to the etching liquid used at the time of processing of the inorganic insulating layer 23 is explained, but the development and the etching may be performed by using different liquids, as long as the processing of the inorganic insulating layer 23 is performed by wet etching, and erosion or breakage of the electroconductive layer 20 do not arise at the time of processing of the inorganic insulating layer 23.

In this case, as the etching liquid used for wet etching of the inorganic insulating layer 23, an alkaline etching liquid is used from the viewpoint of suppressing erosion of the electroconductive layer 20.

Specifically, the following resist pattern forming process and processing process may be used in place of the above developing process.

(6-1) Resist Pattern-Forming Process

In the resist pattern-forming process, as shown in (A) of FIG. 12, a photoresist film 30 which has been subjected to the exposure process is developed with a developer similarly to the developing process above, so that the area (in the case of a positive-working photoresist, the area 30A where the photoresist is irradiated with light (refer to (C) of FIG. 8)) where the photoresist film 30 through the exposure process is soluble in the developer is removed, and the area 30B where the photoresist is not irradiated with light (refer to (C) of FIG. 8) is left as a resist pattern 30B'. In this way, a state where the area 22A other than the area (inorganic insulating layer 22) which is continuously contiguous with the resist pattern 30B in the inorganic insulating layer 23 becomes exposed on the surface is formed.

Although the formation of the resist pattern 30B' in this resist pattern-forming process may be performed by using the same method as the resist pattern 30B' in the developing process, there is a wider range of choices of developers as compared with those of the developing process in the above. That is, the developer used in the resist pattern-forming process only needs to be a liquid capable of dissolving the area 30B of the photoresist film 30, and may be a liquid in which the inorganic insulating layer 23 is insoluble.

Further, the method of forming the resist pattern 30B' in the resist pattern-forming process is not limited to wet etching.

(6-2) Processing Process

In the processing process, as shown in (B) of FIG. 12, the area 22A exposed from the resist pattern 30B' in the inorganic insulating layer 23 formed in the resist pattern-forming process is removed by wet etching with an alkaline etching liquid, thereby forming a contact hole 27. The alkaline etching liquid used in the processing process has a wide range of choices as compared with the etching liquid when the alkaline etching liquid is used in the above developing process. That is, the alkaline etching liquid used in the processing process only needs to be an alkaline liquid which can dissolve the inorganic insulating layer 23 and does not dissolve the electroconductive layer 20, and further may be a liquid unsuitable as a developer for the photoresist film 30.

In this way, by dividing the processing of the inorganic insulating layer 23 into two steps of processes, the developer used for developing the resist pattern 30B', and the alkaline etching liquid used for processing of the inorganic insulating layer 23 can be different liquids from each other. For this reason, erosion or breakage of the electroconductive layer 20 at the time of forming the contact hole 27 can be suppressed, while the developer and the etching liquid have a wider range of choices.

Further, as compared with the case where the developer used for forming the resist pattern 30B' is used as the etching liquid used for processing of the inorganic insulating layer 23, a liquid which is more suitable for forming the resist pattern 30B' can be selected as the developer, and furthermore, a liquid which is more suitable for processing the inorganic insulating layer 23 can be selected as the alkaline etching liquid. Accordingly, the shape and the taper angle of the contact hole 27 formed in the inorganic insulating layer 23 can be adjusted to a more desirable shape and angle, thereby forming the contact hole 27 with high accuracy.

The field-effect transistor 10 manufactured in the present exemplary embodiment is suitably applied to various devices such as a display device, an electromagnetic wave detector or the like. Hereinafter, an exemplary embodiment will be described.

(Display Device)

The field-effect transistor 10 manufactured in the present exemplary embodiment is preferably applied to display devices such as an image display device using a liquid crystal, an EL element, in particular, a flat panel display (FPD) or the like. More preferably, the field-effect transistor 10 is used for a flexible display device using a flexible board such as an organic plastic film as a substrate. In particular, the field-effect transistor 10 of the present exemplary embodiment is suitably used for a display device using an organic EL device.

When the field-effect transistor 10 is applied to an organic EL display device, for example, as shown in FIG. 13, the organic EL display device may be exemplified by an organic EL display device 50 having an organic EL element 41 which is structured such that an electrode layer 24, an organic EL layer 40 and an upper electrode layer 42 are laminated in this order on an inorganic insulating layer 22 which has a contact hole 27 formed in the field-effect transistor 10 manufactured in the present exemplary embodiment.

Further, although an illustration is omitted, as the organic EL layer 40, for example, by using an organic EL layer 40 having a configuration, in which pixel areas formed of three colors of R, G, and B are one-dimensionally or two-dimensionally arrayed, an organic EL display device is configured such that the field-effect transistors 10 each are arrayed corresponding to each pixel area, so that an organic EL display device in which the field-effect transistors 10 each are arrayed corresponding to each pixel area can be formed.

When the field-effect transistor 10 is applied to a display device using a liquid crystal element, the display device may be configured by using a liquid crystal layer in place of the organic EL layer.

Here, as described above, in the inorganic insulating layer 22 of the field-effect transistor 10, since the contact hole 27 is formed in a state where erosion or damage is suppressed, it is thought that the electroconductive layer 20 of the field-effect transistor 10 is electrically connected to the electrode layer 24 of the organic EL device 41 in a good contact state, so that it is thought that the drive performance can be attained.

(Electromagnetic Wave Detector)

The field-effect transistor 10 manufactured in the present exemplary embodiment is suitably used for an electromagnetic wave detector which detects an image with electromagnetic waves such as radiation such as X-rays, visible lights, ultraviolet rays or the like.

When the field-effect transistor 10 is applied to the electromagnetic wave detector, for example, as shown in FIG. 14, the electromagnetic wave detector may be exemplified by an electromagnetic wave detector 60 having a detection element 66 structured by laminating an electrode layer 24, a charge generation layer 62 which generates charges according to the electromagnetic wave to be detected and a transparent bias electrode 64 on an inorganic insulating layer 22 having a contact hole 27 therein, in the field-effect transistor 10 manufactured in the present exemplary embodiment. The electrode layer 24 functions as a charge collection electrode which collects the electric fields generated in the charge generation layer 62.

In such an electromagnetic wave detector 60, when electromagnetic waves such as X-rays are incident upon the charge generation layer 62, charges are generated in the charge generation layer 62. The generated charges are accumulated in a capacitor 26 through the electrode layer 24, and when the transistor element 15 in the field-effect transistor 10 becomes ON-state, the charges are taken out to outside. And, the electromagnetic wave detectors 60 are one-dimensionally or two-dimensionally arrayed, the field-effect transistor 10 in each electromagnetic wave detector 60 is progressively scanned (charge readout), so that one-dimensional or two-dimensional charge information, namely, an image is readout, and thus, the electromagnetic wave detector 60 can also used as an electromagnetic wave detector for detecting an image used for an image pickup element or the like.

Here, as described above, since the contact hole 27 is formed in a state where erosion or damage is suppressed in the inorganic insulating layer 22 of the field-effect transistor 10, it is thought that the electroconductive layer 20 of the field-effect transistor 10 is electrically connected to the electrode layer 24 of the detector element 66 in a good contact state, so that it is thought that the drive performance can be improved.

In addition, as described above, the electrode layer 24 is made transparent (transmittance to visible light is 50% or more) by selecting the constituent material thereof, and transparent materials are also selected for the field-effect transistor 10, so that the charge generation layer 62 can be irradiated with backlight for afterimage-erase, thereby improving the detection performance.

That the "irradiation with backlight for afterimage-erase" means that the charge generation layer 62 is irradiated with electromagnetic waves through the electrode layer 24 from the substrate 12 side. Namely, when the electrode layer 24 is transparent, the charge generation layer 62 is irradiated with electromagnetic waves from the bias electrode 64 side of the electromagnetic wave detector 60 when an image is recorded, and when the charges which are left in the charge generation layer 62 are erased, the charge generation layer 62 is irradiated with electromagnetic waves from the substrate 12 side of the electromagnetic wave detector 60 through the field-effect transistor 10 and the electrode layer 24, so that it is thought that the drive performance can be improved.

EXAMPLES

Hereinafter, an exemplary embodiment in which a field-effect transistor manufactured by using the method of manufacturing the field-effect transistor of the present invention, and an electromagnetic wave detector to which the field-effect transistor is applied is explained by way of examples, but the present invention is not limited to the examples.

Example 1

In Example 1, a field-effect transistor 1 and an electromagnetic wave detector using the field-effect transistor 1 were manufactured.
Manufacture of Field-Effect Transistor 1
—Electroconductive Layer-Forming Process—

In the electroconductive layer-forming process, a laminate (refer to the laminate 10A of (C)) of FIG. 3 formed by laminating a gate electrode and a lower electrode, a gate insulating film, and an electroconductive layer on a substrate in sequence was formed.

As the substrate, alkali-free glass (EAGLE 2000 (trade name; manufactured by Corning Incorporated) was used.

Next, on this substrate, as an electrode layer to form the gate electrode and the lower electrode, Mo was vapor-deposited to a thickness of 40 nm, and the gate electrode and the lower electrode were patterned. The sputtering was performed under the following conditions:

Mo sputtering conditions: DC power was 380 W, and the flow rate of the sputtering gas Ar was 12 sccm, using a DC sputtering device; and
a photolithographic method and a wet etching method were used in the sputtering process.

Further, the following gate insulating film was formed on the gate electrode and the lower electrode:

The gate insulating film was formed by using $SiO_2$ to a thickness of 200 nm by an RF magnetron sputter vacuum deposition method (conditions: target $SiO_2$; film-forming temperature; 54° C., flow rate of sputtering gas $Ar/O_2$=12/2 sccm, RF power; 400 W, and film-forming pressure; 0.4 Pa). The patterning of the gate insulating film $SiO_2$ was performed by using a shadow mask at the time of sputtering.

On this gate insulating film, IZO was vapor-deposited to a thickness of 200 nm as an electroconductive layer 20. The sputtering was performed under the following conditions:

Sputtering conditions of IZO: DC power was 40 W, and the flow rate of the sputtering gas Ar was 12 sccm, using a DC sputtering device, and oxygen was not introduced.

Next, a resist pattern was formed on the electroconductive layer. The resist pattern was formed by applying resist by using a spin coater, and the film thickness was 1 μm. After forming this resist film, baking was carried out at 90° C. Next, the electroconductive layer was processed by etching an area exposed from the resist pattern in the electroconductive layer, using a mixed solution of phosphoric acid and nitric acid at a liquid temperature of 25° C. as an etching liquid, thereby forming a source electrode, a drain electrode and a pixel electrode. This pixel electrode functions as an electrode (may be referred to as an upper electrode) which constitutes a capacitor together with the formed lower electrode.

The taper angles of the source electrode and the drain electrode thus formed which were read from photographs using cross-sectional TEM photographs were 25°. In addition, the taper angle of the source electrode was obtained from the angle between the bottom surface and the side surface at the end of the cross-section of the source electrode. Further, the taper angle of the drain electrode was obtained from the angle between the bottom surface and the side surface at the end of the cross-section of the drain source electrode. The bottom surface refers to the surface of the substrate surface side of each the source electrode and the drain electrode.

Oxide Semiconductor Layer-Forming Process

Next, an oxide semiconductor layer formed from an amorphous oxide semiconductor was formed on the source electrode and the drain electrode. The oxide semiconductor layer was formed by using a polycrystalline sintered body having a composition of $InGaZnO_4$ used as a target on the source electrode and the drain electrode in the electroconductive layer 20 by an RF magnetron sputtering vapor deposition method under the conditions of Ar flow rate of 97 sccm, an $O_2$ flow rate of 1.6 sccm, an RF power of 200 W and a pressure of 0.38 Pa. The thickness was 20 nm.

Inorganic Insulating Layer-Forming Process, Resist-Forming Process, Exposure Process Next, $Ga_2O_3$ as an inorganic insulating layer was vapor-deposited to a thickness of 50 nm on the oxide semiconductor layer and the electroconductive layer (the source electrode, the drain electrode and the pixel electrode) formed in the above. The sputtering was performed under the following conditions:

Sputtering conditions: $Ga_2O_3$ was used as a target, by using an RF magnetron sputtering device, at an RF power of 100 W, the flow rate of sputtering gas Ar was 12 sccm, and the flow rate of sputtering gas $O_2$ was 5.0 sccm.

Next, a photoresist film was formed on the inorganic insulating layer, and was exposed in a pattern shape such that the area corresponding to the pixel electrode in the electroconductive layer as a part of the electroconductive layer was exposed as the contact hole.

Specifically, by using AZ5214-E (trade name; manufactured by AZ Electronic Materials K.K.) as a resist, the photoresist film was formed by coating the resist by using a spin coater, pre-baked at 90° C. for 15 minutes, and was pattern-exposed.

Developing Process

In the developing process, was immersed the resist film in AZ300MIF DEVELOPER (trade name; manufactured by AZ Electronic Materials K.K.) as an alkaline developer for 90 seconds.

In this way, the resist film formed on the inorganic insulating layer was developed to form the resist pattern, and the area exposed from the resist pattern in the inorganic insulating layer formed at the lower layer side of the photoresist layer was removed. Accordingly, it was confirmed that the inorganic insulation layer was processed by wet etching using by the alkaline developer, thereby forming a contact hole.

Regarding the photoresist film developed in the developing process in Example 1, the dissolution rate of the photoresist film in the alkaline developer (etching liquid) at a temperature of 25° C. used in Example 1 was 30 nm/s, and it was confirmed that the photoresist film had a solubility in the alkaline developer.

Similarly, regarding the inorganic insulating layer etched in the developing process in Example 1, the dissolution rate of the inorganic insulating layer in the alkaline developer used in Example 1 (etching liquid) at a temperature of 25° C. was 2.5 nm/s, and it was confirmed that the inorganic insulating layer had a solubility in the alkaline developer (etching liquid).

Next, a field-effect transistor 1 was manufactured by stripping the resist pattern using a neutral stripping liquid 104 (trade name; manufactured by Tokyo Ohka Kogyo Co. Ltd.).

The taper angle of the periphery at the bottom of the contact hole in the inorganic insulating layer of the field-effect transistor 1 thus manufactured, measured by using a cross-sectional TEM photograph, was 70°.

Here, the taper angle of the periphery at the bottom of the contact hole in the inorganic insulating layer was obtained by measuring the angle between the side surface (corresponding to the inner peripheral surface of the contact hole) formed by the contact hole in the inorganic insulating layer and the bottom surface (the surface at the substrate side) of the inorganic insulating layer.

—Manufacture of Electromagnetic Wave Detector—

IZO was vapor-deposited to a thickness of 40 nm as an electrode layer 24 (refer to FIG. 14) which functions as a charge collection electrode on the inorganic insulating layer in which the contact hole was formed in the field-effect transistor 1. Sputtering was performed under the following conditions:

Sputtering conditions of IZO: DC power was 40 W, and the flow rate of sputtering gas Ar was 12 sccm using a DC sputtering device, and oxygen was not introduced.

Further, the charge collection layer was laminated on the charge collection electrode by resistance heating vapor-depositing amorphous selenium to a thickness of 500 μm. Further, a bias electrode was formed by resistance heating vapor-depositing Au to a thickness of 0.1 μm on the charge collection layer. In this way, an electromagnetic wave detector as shown in FIG. 14 was manufactured.

The electromagnetic wave detector thus manufactured was irradiated with X-rays at a exposure dose of 1 mR using an X-ray irradiation device having a tungsten filament and 20 mm Al filter at a voltage of 80 kVp, in a state where a positive bias voltage (+5 kV) was applied to a bias electrode, a voltage of −5 V was applied to the gate electrode of the field-effect transistor 1, and the source electrode (common) was set to 0 V. Next, a voltage of +10 V was applied to the gate electrode for 10 μs so that the transistor element (refer to the transistor element 15 in FIG. 14) of the field-effect transistor 1 is in an ON-state, thereby detecting the charge extracted from the source electrode. The charge detection was performed by detecting the charge amount of the charge extracted from the source electrode using a charge amplifier detection circuit. The detected charge amount was 2,500 $pCcm^{-2}$, and favorable electromagnetic wave detection was confirmed.

Example 2

In Example 2, a display equipped with a liquid crystal element was manufactured using the field-effect transistor 1 manufactured in Example 1.

—Manufacture of Display—

IZO was vapor-deposited to a thickness of 40 nm as an electrode layer 24 (refer to FIG. 13) on the inorganic insulating layer in which the contact hole was formed in the field-effect transistor 1 manufactured in Example 1. Sputtering was performed under the following conditions:

Sputtering conditions of IZO: DC power was 40 W, and the flow rate of sputtering gas Ar was 12 sccm using a DC sputtering device; and oxygen was not introduced.

Further, on the electrode layer, as a clearance-forming member that maintains the clearance between the substrate to be formed in the later process and the electrode layer, after a spacer member made of an acrylic resin was formed to a thickness of 10 μm, the substrate having an ITO electrode was laminated and is fixed to the clearance member with an adhesive layer. As a liquid crystal material that forms a liquid crystal layer, after LIXON4032 (trade name; liquid crystal material, manufactured by Chisso Petrochemical Corporation) was injected into the region (which may be referred to as a cell) surrounded by the substrate, the electrode layer and the clearance-forming member, an injection hole was shielded, thereby forming a display device.

An image was displayed on the liquid crystal layer of the manufactured display device, by making a signal wire voltage to a maximum of 5 V, thereby confirming a good image display.

Comparative Example 1

In Comparative Example 1, a comparative transistor 1 was manufactured in the same manufacturing method and conditions as those of the field-effect transistor 1, except that an acrylic resin layer made of an acrylic resin is formed on the oxide semiconductor layer and the electroconductive layer in place of the inorganic insulating layer formed on the oxide semiconductor layer and the electroconductive layer in the manufacturing process of the field-effect transistor 1 manufactured in Example 1. In addition, the formation of the contact hole in the acrylic resin was performed by the same wet etching method as that of the formation of the contact hole in the inorganic insulation layer in the manufacturing process of the field-effect transistor 1.

In addition, the layer (hereinafter, referred to as the comparison layer 1) made of an acrylate resin was formed by the following method. First, as the acrylic resin, an alkali-soluble acrylic resin (JEM-531; trade name; manufacture by JSR Corporation) was coated using acetone, and the comparative layer 1 made of the acrylic resin having a thickness of 50 nm was formed.

Comparative Example 2

In Comparative Example 2, the inorganic insulating layer in the manufacturing process of the field-effect transistor 1 formed in Example 1 was changed to an insulating layer formed from $SiO_2$.

Specifically, the comparative transistor 2 was manufactured in the same manufacturing method and conditions as those of the field-effect transistor 1, except that a layer (hereinafter, referred to as the comparative layer 2) made of $SiO_2$ is formed on the oxide semiconductor layer and the electroconductive layer in place of the inorganic insulating layer formed on the oxide semiconductor layer and the electroconductive layer in the manufacturing process of the field-effect transistor 1 manufacture in Example 1.

In addition, the comparison layer 2 formed from $SiO_2$ was formed by the following method.

Specifically, the layer (50 nm) formed from $SiO_2$ was formed by a sputtering method on the oxide semiconductor layer and the electroconductive layer in the manufacturing process of the field-effect transistor 1 manufactured in Example 1. As the sputtering conditions, $SiO_2$ was used as a target, and as a sputtering gas, an oxidizing atmosphere of oxygen gas at a flow rate of 5 sccm and argon gas at a flow rate of 5 sccm in a mixed ratio of 50 vol % was used.

Next, in the comparative layer 2 formed from $SiO_2$, a contact hole in the comparative layer 2 was formed by dry etching with $CF_4$ gas. In addition, the wet etching cannot be performed because the comparative layer 2 had acid resistance and alkali resistance, therefore, the comparative layer 2 was processed by dry etching.

—Evaluation—
—Evaluation of Erosion and Breakage State of Electroconductive Layer—

When the contact hole in the inorganic insulating layer was formed in the manufacturing process of the field-effect transistor 1 manufactured in Example 1, the area exposed through the formation of the contact hole in the electroconductive layer was checked by using a cross-sectional TEM photograph, and it was confirmed that the electroconductive layer as an under layer was left, and was also confirmed that erosion or breakage of the electroconductive layer resulting from the formation of the contact hole were prevented.

Further, in the manufacturing process of the comparative transistor 1 manufactured in Comparative Example 1, the area exposed through the formation of the contact hole in the electroconductive layer was checked similarly in the case where a contact hole was formed in the comparative layer 1 formed from an acrylic resin, and an portion where the acrylic resin is not present in the area other than the contact hole was observed. That is, it was difficult to form a thin insulating layer.

On the other hand, in the manufacturing process of the comparative transistor 2 manufactured in Comparative Example 2, the area exposed through the formation of the contact hole in the electroconductive layer was checked similarly in the case where a contact hole was formed in the comparative layer 2 formed from $SiO_2$, and the result of a taper angle of 60° was confirmed, and thus, it was confirmed the contact hole was favorably formed.

—Evaluation of Protective Property—

In the field-effect transistor 1 obtained in Example, the comparative transistor 1 and the comparative transistor 2 obtained in Comparative Examples, the source electrode and the drain electrode were short-circuited, and a stress current was applied by a diode connection for 14 hours such that the stress current IDS was 3 µA.

The change in the amount of the threshold values before and after the application of the stress was defined as the quantity of the threshold shift (ΔVth), the evaluation was preformed, and the quantity of the threshold shift of the field-effect transistor 1 was 0.2 V, the quantity of the threshold shift of the comparative transistor 1 was 2 V, and the OFF current of the comparative transistor 2 was very large, the OFF operation was impossible to obtain even in the early measurement stage.

As described above, the quantity of the threshold shift of the field-effect transistor 1 manufactured in Example 1 was small and showed a stable performance, as compared with those of the comparative transistor 1 manufactured in Comparative Example 1 and the comparative transistor 2 manufactured in Comparative Example 2.

Thus, it was confirmed that erosion and breakage of the electroconductive layer of the field-effect transistor 1 manufactured in Example 1 at the time of forming the contact hole was prevented, and the field-effect transistor 1 showed a stable performance and favorably protects the oxide semiconductor layer and the electroconductive layer, as compared with those of the comparative transistor 1 manufactured in Comparative Example 1 and the comparative transistor 2 manufactured in Comparative Example 2.

The invention includes the following exemplary embodiments:

(1) A method of manufacturing a field-effect transistor including a substrate, a gate electrode, a gate insulating film, a source electrode, a drain electrode, a pixel electrode, an oxide semiconductor layer containing an oxide semiconductor as a main component and an inorganic insulating layer containing an inorganic material as a main component, the method comprising:

forming an electroconductive layer containing at least one of the source electrode, the drain electrode or the pixel electrode;

forming the inorganic insulating layer so as to cover the electroconductive layer and the oxide semiconductor layer;

resist-forming a photoresist film on the inorganic insulating layer;

exposing the photoresist film in a pattern shape; and developing, using a developer, the exposed photoresist film to form a resist pattern, and removing an area of the inorganic insulating layer exposed from the resist pattern by using the developer as an etching liquid, thereby exposing a part of the electroconductive layer.

(2) The method of manufacturing the field-effect transistor according to (1), the method further comprising:

forming an electrode layer such that the electrode layer is electrically connected to the electroconductive layer, a part of which has been exposed by the developing, through the exposed area; wherein the electrode layer contains a metal oxide as a main component.

(3) A method of manufacturing a field-effect transistor including a substrate, a gate electrode, a gate insulating film, a source electrode, a drain electrode, a pixel electrode, an oxide semiconductor layer containing an oxide semiconductor as a main component and an inorganic insulating layer containing an inorganic material as a main component, the method comprising:

forming an electroconductive layer containing at least one of the source electrode, the drain electrode or the pixel electrode;

forming the inorganic insulating layer so as to cover the electroconductive layer and the oxide semiconductor layer;

resist-forming a photoresist film on the inorganic insulating layer;

exposing the photoresist film in a pattern shape;

forming a resist pattern by developing, using a developer, the exposed photoresist film; and processing an area of the inorganic insulating layer exposed from the resist pattern by using an etching liquid to remove the exposed area, thereby exposing a part of the electroconductive layer.

(4) The method of manufacturing the field-effect transistor according to (3), the method further comprising:

forming an electrode layer such that the electrode layer is electrically connected to the electroconductive layer, a part of which has been exposed by the processing, through the exposed area; wherein the electrode layer contains a metal oxide as a main component.

(5) The method of manufacturing the field-effect transistor according to (1) 1 or (3), wherein the oxide semiconductor layer comprises an amorphous oxide semiconductor represented by $InGaO_3(ZnO)_m$ (m representing a natural number less than 6).

(6) The method of manufacturing the field-effect transistor according to (1) or (3), wherein the inorganic material is a Ga-containing oxide.

(7) The method of manufacturing the field-effect transistor according to (1) or (3), wherein the inorganic material is amorphous.

(8) The method of manufacturing the field-effect transistor according to (1) or (3), wherein the etching liquid is an alkaline solution.

(9) A field-effect transistor manufactured by the method of manufacturing the field-effect transistor according to (1) or (3).

(10) A display device comprising a field-effect transistor manufactured by the method of manufacturing the field-effect transistor according to (1) or (3).

(11) An electromagnetic wave detector comprising a field-effect transistor manufactured by the method of manufacturing the field-effect transistor according to (1) or (3).

All publications, patent applications, and technical standards mentioned in this specification are herein incorporated by reference to the same extent as if each individual publication, patent application, or technical standard was specifically and individually indicated to be incorporated by reference.

What is claimed is:

1. A method of manufacturing a field-effect transistor including a substrate, a gate electrode, a gate insulating film, a source electrode, a drain electrode, a pixel electrode, an oxide semiconductor layer containing an oxide semiconductor, and an inorganic insulating layer containing a Ga-containing oxide, the method comprising:

forming an electroconductive layer containing at least one selected from the group consisting of the source electrode, the drain electrode and the pixel electrode;

forming the inorganic insulating layer, by a vapor phase film-forming method, so as to cover the electroconductive layer and the oxide semiconductor layer;

resist-forming a photoresist film on the inorganic insulating layer;

exposing the photoresist film in a pattern shape; and developing, using a developer, the exposed photoresist film to form a resist pattern, and removing an area of the inorganic insulating layer exposed from the resist pattern by using the developer as an etching liquid, wherein the etching liquid is an alkaline solution, thereby exposing a part of the electroconductive layer, wherein the gate electrode is provided on the substrate, the gate insulating film is provided between the gate electrode and the electroconductive layer, the oxide semiconductor layer is provided to contact at least the electroconductive layer, and the inorganic insulating layer covers the electroconductive layer and the oxide semiconductor layer.

2. The method of manufacturing the field-effect transistor according to claim 1, the method further comprising:

forming an electrode layer such that the electrode layer is electrically connected to the electroconductive layer, through the exposed part of the electroconductive layer;

wherein the electrode layer contains a metal oxide.

3. The method of manufacturing the field-effect transistor according to claim 1, wherein the oxide semiconductor layer comprises an amorphous oxide semiconductor represented by $InGaO_3(ZnO)_m$, m representing a natural number less than 6.

4. The method of manufacturing the field-effect transistor according to claim 1, wherein the Ga-containing oxide is amorphous.

5. A method of manufacturing a field-effect transistor including a substrate, a gate electrode, a gate insulating film, a source electrode, a drain electrode, a pixel electrode, an oxide semiconductor layer containing an oxide semiconductor, and an inorganic insulating layer containing a Ga-containing oxide, the method comprising:

forming an electroconductive layer containing at least one selected from the group consisting of the source electrode, the drain electrode and the pixel electrode;

forming the inorganic insulating layer, by a vapor phase film-forming method, so as to cover the electroconductive layer and the oxide semiconductor layer;

resist-forming a photoresist film on the inorganic insulating layer;

exposing the photoresist film in a pattern shape;

forming a resist pattern by developing, using a developer, the exposed photoresist film; and processing an area of the inorganic insulating layer exposed from the resist pattern by using an etching liquid, wherein the etching liquid is an alkaline solution, to remove the exposed area, thereby exposing a part of the electroconductive layer, wherein the gate electrode is provided on the substrate, the gate insulating film is provided between the gate electrode and the electroconductive layer, the oxide semiconductor layer is provided to contact at least the electroconductive layer, and the inorganic insulating layer covers the electroconductive layer and the oxide semiconductor layer.

6. The method of manufacturing the field-effect transistor according to claim 5, the method further comprising:

forming an electrode layer such that the electrode layer is electrically connected to the electroconductive layer, through the exposed part of the electroconductive layer;

wherein the electrode layer contains a metal oxide.

7. The method of manufacturing the field-effect transistor according to claim 5, wherein the oxide semiconductor layer comprises an amorphous oxide semiconductor represented by $InGaO_3(ZnO)_m$, m representing a natural number less than 6.

8. The method of manufacturing the field-effect transistor according to claim 5, wherein the Ga-containing oxide is amorphous.

* * * * *